(12) United States Patent
Takatsuka

(10) Patent No.: US 9,024,477 B2
(45) Date of Patent: May 5, 2015

(54) HIGH VOLTAGE POWER SOURCE DEVICE AND IMAGE FORMING DEVICE

(75) Inventor: Ryo Takatsuka, Tokyo (JP)

(73) Assignee: Oki Data Corporation, Tokyo (JP)

( * ) Notice: Subject to any disclaimer, the term of this patent is extended or adjusted under 35 U.S.C. 154(b) by 632 days.

(21) Appl. No.: 13/397,953

(22) Filed: Feb. 16, 2012

(65) Prior Publication Data

US 2012/0212061 A1 Aug. 23, 2012

(30) Foreign Application Priority Data

Feb. 23, 2011 (JP) ................................. 2011-037551

(51) Int. Cl.
| | |
|---|---|
| *H02J 1/00* | (2006.01) |
| *G03G 15/00* | (2006.01) |
| *H01L 41/04* | (2006.01) |
| *H02M 1/44* | (2007.01) |
| *H02M 3/335* | (2006.01) |
| *H02M 1/00* | (2006.01) |

(52) U.S. Cl.
CPC .............. *G03G 15/80* (2013.01); *H01L 41/044* (2013.01); *H02M 1/44* (2013.01); *H02M 3/33507* (2013.01); *H02M 2001/008* (2013.01)

(58) Field of Classification Search
CPC .. H01L 41/044; H02M 1/44; H02M 3/33507; H02M 2001/008; H02G 15/80
USPC .......................................................... 307/80
See application file for complete search history.

(56) References Cited

U.S. PATENT DOCUMENTS

| | | | | |
|---|---|---|---|---|
| 6,184,631 | B1* | 2/2001 | Noma et al. ................... | 315/224 |
| 7,265,479 | B2* | 9/2007 | Yamaguchi et al. .......... | 310/318 |
| 8,350,550 | B2* | 1/2013 | Kosaka .......................... | 323/283 |
| 8,549,742 | B2* | 10/2013 | Yamamoto ....................... | 29/836 |
| 2006/0072255 | A1* | 4/2006 | Chou et al. ....................... | 361/35 |
| 2007/0200455 | A1* | 8/2007 | Yamaguchi ................... | 310/318 |

FOREIGN PATENT DOCUMENTS

| | | |
|---|---|---|
| JP | 2003-235255 A | 8/2003 |
| JP | 2006-081233 A | 3/2006 |
| JP | 2006-129673 A | 5/2006 |
| JP | A-2010-107608 | 5/2010 |
| JP | 2010-268545 A | 11/2010 |

* cited by examiner

*Primary Examiner* — Rexford Barnie
*Assistant Examiner* — Toan Vu
(74) *Attorney, Agent, or Firm* — Muncy, Geissler, Olds & Lowe, P.C.

(57) ABSTRACT

A high voltage power source device includes piezoelectric transformers, each of the piezoelectric transformers being formed with a primary electrode and a secondary electrode on piezoelectric ceramics, receiving a primary voltage at the primary electrode, and generating a second voltage from the secondary electrode, switching elements, each of the switching elements driving a respective one of the piezoelectric transformers, and primary voltage supply devices, each of the primary voltage supply devices supplying the primary voltage to the primary electrode of the respective one of the piezoelectric transformers by driving the respective one of the switching elements when the secondary voltage is generated from the respective one of the second electrodes, wherein the respective one of the primary voltage supply devices supplies the primary voltage to the respective one of the primary electrodes by driving the respective one of the switching elements at the same frequency.

15 Claims, 17 Drawing Sheets

| Output Volt. [-V] | Invert. Amp. Input Volt. [-V] | Invert. Amp. Output Volt. [-V] | DAC Set Value 8 bits |
|---|---|---|---|
| 800 | 0.40 | 1.32 | 65h |
| 810 | 0.40 | 1.34 | 67h |
| 820 | 0.41 | 1.35 | 68h |
| 830 | 0.41 | 1.37 | 69h |
| 840 | 0.42 | 1.39 | 6Bh |
| 850 | 0.42 | 1.40 | 6Ch |
| 860 | 0.43 | 1.42 | 6Dh |
| 870 | 0.43 | 1.43 | 6Eh |
| 880 | 0.44 | 1.45 | 70h |
| 890 | 0.44 | 1.47 | 71h |
| 900 | 0.45 | 1.48 | 72h |
| 910 | 0.45 | 1.50 | 73h |
| 920 | 0.46 | 1.52 | 75h |
| 930 | 0.46 | 1.53 | 76h |
| 940 | 0.47 | 1.55 | 77h |
| 950 | 0.47 | 1.57 | 79h |
| 960 | 0.48 | 1.58 | 7Ah |
| 970 | 0.48 | 1.60 | 7Bh |
| 980 | 0.49 | 1.62 | 7Ch |
| 990 | 0.49 | 1.63 | 7Eh |
| 1000 | 0.50 | 1.65 | 7Fh |
| 1010 | 0.50 | 1.67 | 80h |
| 1020 | 0.51 | 1.68 | 81h |
| 1030 | 0.51 | 1.70 | 83h |
| 1040 | 0.52 | 1.72 | 84h |
| 1050 | 0.52 | 1.73 | 85h |
| 1060 | 0.53 | 1.75 | 87h |
| 1070 | 0.53 | 1.76 | 88h |
| 1080 | 0.54 | 1.78 | 89h |
| 1090 | 0.54 | 1.80 | 8Ah |
| 1100 | 0.55 | 1.81 | 8Ch |
| 1110 | 0.55 | 1.83 | 8Dh |
| 1120 | 0.56 | 1.85 | 8Eh |
| 1130 | 0.56 | 1.86 | 90h |
| 1140 | 0.57 | 1.88 | 91h |
| 1150 | 0.57 | 1.90 | 92h |
| 1160 | 0.58 | 1.91 | 93h |
| 1170 | 0.58 | 1.93 | 95h |
| 1180 | 0.59 | 1.95 | 96h |
| 1190 | 0.59 | 1.96 | 97h |
| 1200 | 0.60 | 1.98 | 98h |

Fig. 10

| Piezoele. Trans. Drive Volt. [V] | ADC 8 bit [V] | Inverter Output 8 bit [V] |
|---|---|---|
| 24.0 | FFh | 00h |
| 23.8 | FCh | 03h |
| 23.6 | FAh | 05h |
| 23.4 | F8h | 07h |
| 23.2 | F6h | 09h |
| 23.0 | F4h | 0Bh |
| 22.8 | F2h | 0Dh |
| 22.6 | F0h | 0Fh |
| 22.4 | EEh | 11h |
| 22.2 | EBh | 14h |
| 22.0 | E9h | 16h |
| 21.8 | E7h | 18h |
| 21.6 | E5h | 1Ah |
| 21.4 | E3h | 1Ch |
| 21.2 | E1h | 1Eh |
| 21.0 | DFh | 20h |
| 20.8 | DDh | 22h |
| 20.6 | DAh | 25h |
| 20.4 | D8h | 27h |
| 20.2 | D6h | 29h |
| 20.0 | D4h | 2Bh |
| 19.8 | D2h | 2Dh |
| 19.6 | D0h | 2Fh |
| 19.4 | CEh | 31h |
| 19.2 | CCh | 33h |
| 19.0 | C9h | 36h |
| 18.8 | C7h | 38h |
| 18.6 | C5h | 3Ah |
| 18.4 | C3h | 3Ch |
| 18.2 | C1h | 3Eh |
| 18.0 | BFh | 40h |
| 17.8 | BDh | 42h |
| 17.6 | BBh | 44h |
| 17.4 | B8h | 47h |
| 17.2 | B6h | 49h |
| 17.0 | B4h | 4Bh |
| 16.8 | B2h | 4Dh |
| 16.6 | B0h | 4Fh |
| 16.4 | AEh | 51h |
| 16.2 | ACh | 53h |
| 16.0 | AAh | 55h |

Fig. 11

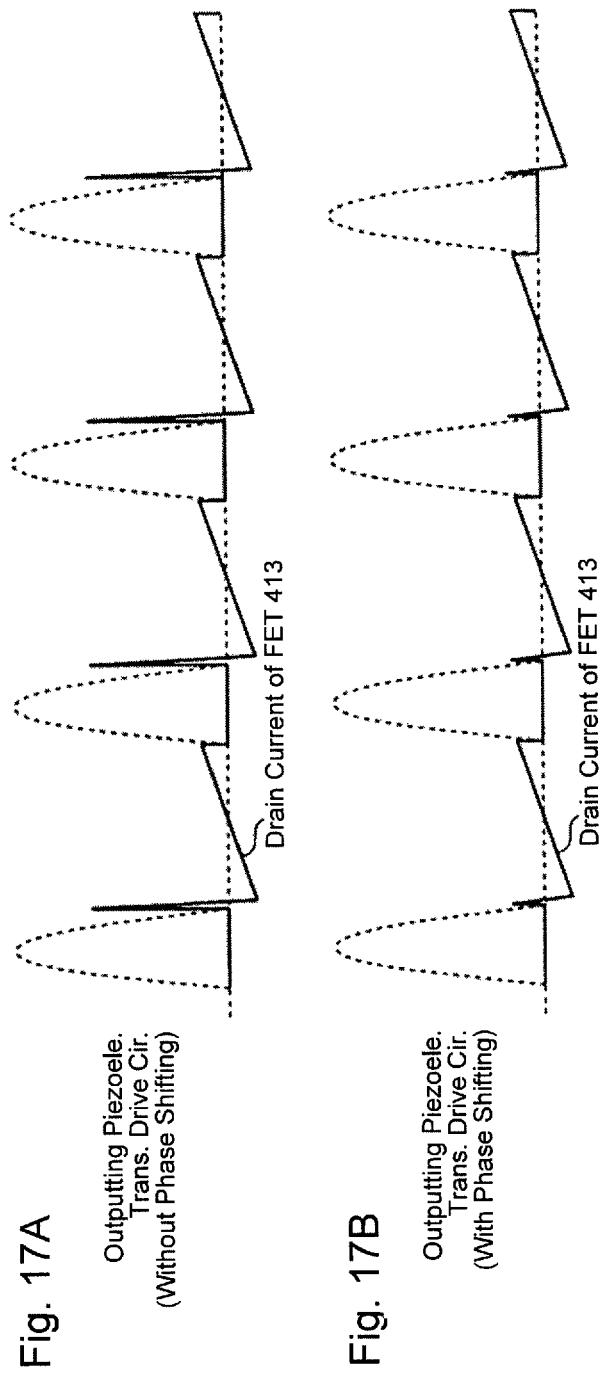

HIGH VOLTAGE POWER SOURCE DEVICE AND IMAGE FORMING DEVICE

CROSS REFERENCE TO RELATED APPLICATION

The present application is related to, claims priority from and incorporates by reference Japanese Patent Application No. 2011-037551, filed on Feb. 23, 2011.

TECHNICAL FIELD

The present application relates to a high voltage power source device that generates high voltage by stepping up low voltage using a transformer and to an image forming device (or image forming apparatus) using the high voltage power source device.

BACKGROUND

A high voltage power source device used in a conventional image forming apparatus includes a digitally controlled piezoelectric transformer provided to each of transfer rollers for respective colors of black, yellow, magenta and cyan, and applies high direct current (DC) voltage to the transfer rollers for the respective colors (see Japanese Laid-Open Patent Application No. 2010-107608 (paragraphs [0020]-[0023] and FIGS. 1 and 12), for example).

However, in the conventional technology, if a plurality of piezoelectric transformers that generate high voltage by stepping up low voltage are provided on a single circuit board, secondary side high voltage outputs interfere with each other when drive pulse frequencies differ among the piezoelectric transformers. Therefore, a problem, such as occurrence of ripples in the high voltage output, occurs, causing a problem of unstable high voltage outputs. The present application considers a solution to the problem and has an object to produce a stable high voltage output when a plurality of piezoelectric transformers are provided in parallel with, and adjacent to, each other.

SUMMARY

For the above solution, a high voltage power source device of this application includes a plurality of piezoelectric transformers, each of the piezoelectric transformers being formed with a primary electrode and a secondary electrode on piezoelectric ceramics, receiving a primary voltage at the primary electrode, and generating a second voltage from the secondary electrode, a plurality of switching elements, each of the switching elements driving a respective one of the piezoelectric transformers, and a plurality of primary voltage supply devices, each of the primary voltage supply devices supplying the primary voltage to the primary electrode of the respective one of the plurality of piezoelectric transformers by driving the respective one of the plurality of switching elements when the secondary voltage is generated from the respective one of the second electrodes, wherein the respective one of the primary voltage supply devices supplies the primary voltage to the respective one of the primary electrodes by driving the respective one of the switching elements at the same frequency.

The present application with such a configuration has an advantage to produce a stable high voltage output when a plurality of piezoelectric transformers are provided in parallel with, and adjacent to, each other.

BRIEF DESCRIPTION OF THE DRAWINGS

FIG. 10 is a correspondence chart for input voltages, input and output voltages for inverting amplifier and DAC configuration values according to the first embodiment.

FIG. 11 is a corresponding chart for the piezoelectric transformer primary side input voltages and the ADC 8 bits.

FIGS. 17A and 17B are explanatory diagrams illustrating waveforms of drain current of piezoelectric transformer primary side field effect transistor (FET) according to the second embodiment.

DETAILED DESCRIPTION OF EMBODIMENTS

Embodiments of a high voltage power source device and an image forming apparatus according to the present application are explained below with reference to the drawings.

First Embodiment

Figure 2:
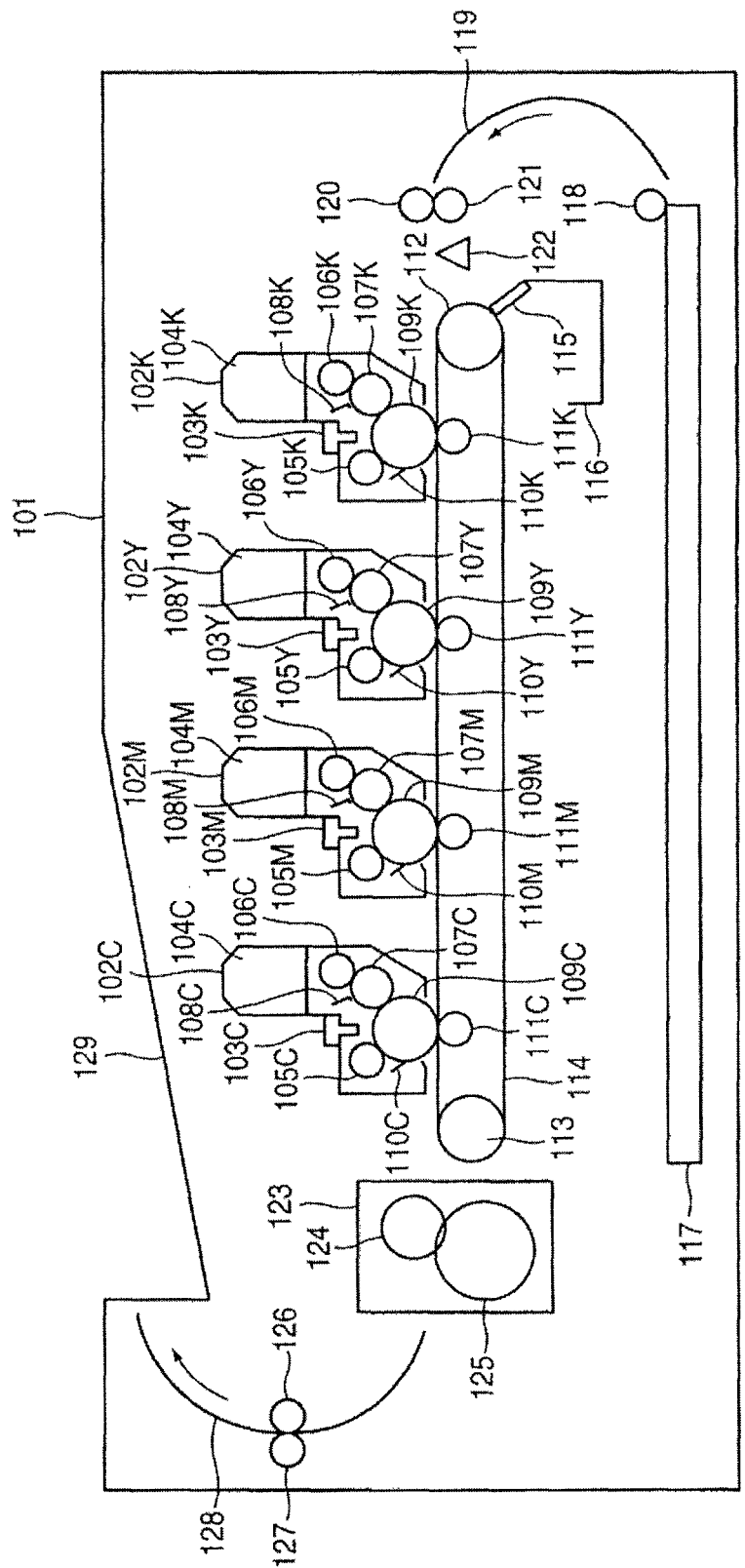
FIG. 2 is a schematic side view illustrating a configuration of an image forming apparatus according to the first embodiment.

FIG. 2 is a schematic side view illustrating a configuration of an image forming apparatus according to a first embodiment. In FIG. 2, reference numeral 101 is an image forming apparatus that includes a high voltage power source device and that performs color printing. The image forming apparatus 101 is, for example, an electrographic color printer, color copy machine and the like. In the present embodiment, the image forming apparatus 101 is explained as an electrographic color printer. In the figure, K, Y, M and C refer to black, yellow, magenta and cyan, respectively. The image forming apparatus 101 performs color printing using toners in these four colors.

Photosensitive bodies (e.g., photosensitive drums 109K, 109Y, 109M and 109C) in respective development units 102K, 102Y, 102M and 102C are uniformly charged by charging rollers 105K, 105Y, 105M and 105C that contact the photosensitive drums 109K, 109Y, 109M and 109C, respectively.

Electrostatic latent images are formed on the charged photosensitive drums 109K, 109Y, 109M and 109C by a black light emitting diode (LED) head 103K, a yellow LED head 103Y, a magenta LED head 103M and a cyan LED head 103C, respectively. The toner is supplied by supply rollers 106K, 106Y, 106M and 106C in the respective development units 102K, 102Y, 102M and 102C to development rollers 107K, 107Y, 107M and 107C. Toner layers are uniformly formed on the respective surfaces of the development rollers 107K, 107Y, 107M and 107C using development blades 108K, 108Y, 108M and 108C. Toner images are developed on the photosensitive drums 109K, 109Y, 109M and 109C by the toner on the surfaces of the development rollers 107K, 107Y, 107M and 107C, respectively.

Cleaning blades 110K, 110Y, 110M and 110C are mechanisms that clean the toner remained on the photosensitive drums 109K, 109Y, 109M and 109C, respectively, after the transfer of toner images to a sheet. A black toner cartridge 104K, a yellow toner cartridge 104Y, a magenta toner cartridge 104M and a cyan toner cartridge 104C are removably installed in the development units 102K, 102Y, 102M and 102C, respectively.

A black transfer roller 111K, a yellow transfer roller 111Y, a magenta transfer roller 111M and a cyan transfer roller 111C are positioned to contact, through a transfer belt 114, the photosensitive drums 109K, 109Y, 109M and 109C, respectively, and form a transfer part that transfers the toner images on the photosensitive drums 109K, 109Y, 109M and 109C to the sheet. A bias voltage is applicable to the black transfer roller 111K, the yellow transfer roller 111Y, the magenta transfer roller 111M and the cyan transfer roller 111C by a high voltage power source device (not shown).

A transfer belt drive roller 112 and a driven roller 113 tension the endless transfer belt 114 and rotate the transfer belt 114 by drive of the transfer belt drive roller 112 to allow the sheet to be carried thereon. A transfer belt cleaning blade 115 is positioned to contact the surface of the transfer belt 114 so as to scrape off the toner remained on the transfer belt 114. The toner scraped by the transfer belt cleaning belt 115 is collected by a transfer belt cleaner container 116.

A sheet cassette 117 is removably installed in the image forming apparatus 101 and stacks and accommodates therein sheets as transferred media. A sheet roller 118 supplies the accommodated sheet from the sheet cassette 117 and carry the sheet along a sheet guide 119. The carried sheet contacts registration rollers 120 and 121 at rest from being rotated. After correcting a skew, the registration rollers 120 and 121 are driven at a predetermined timing to carry the sheet to the transfer belt 114. At this time, a sheet detection sensor 122 detects, with or without contact thereto, the sheet being carried.

A fuser 123 fixes the toner image transferred onto the sheet by heat and pressure at the transfer part using heat fusion rollers 124 and 125 as heating and pressure members. Ejection rollers 126 and 127 carry the sheet on which the toner image has been fixed, along a sheet guide 128 and eject to an ejection tray 129 the sheet with the printed surface down.

Figure 3:
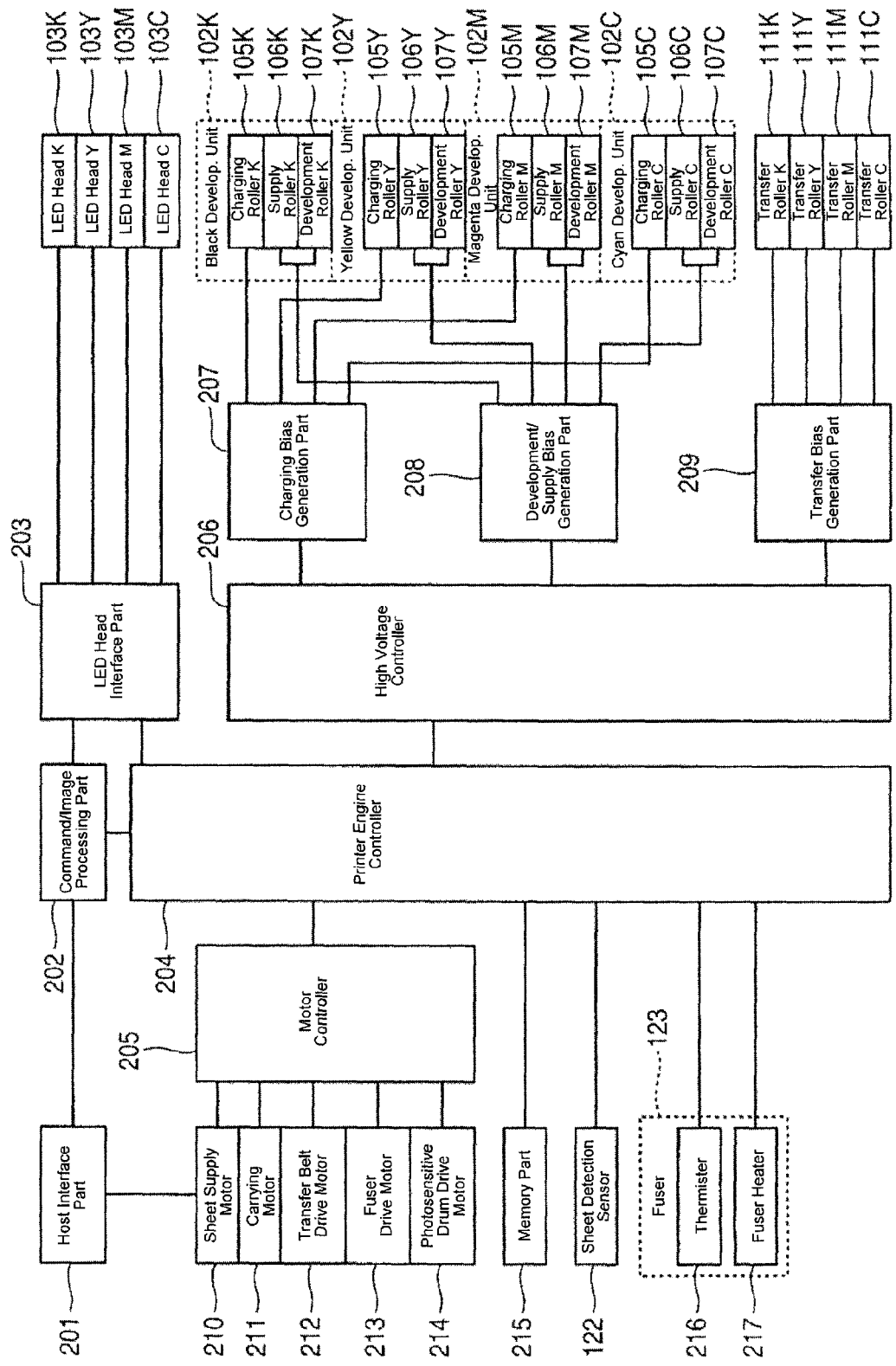
FIG. 3 is a block diagram illustrating a control configuration of the image forming apparatus according to the first embodiment.

FIG. 3 is a block diagram illustrating a control configuration of the image forming apparatus according to the first embodiment. In FIG. 3, a host interface part 201 notifies a command/image processing part 202 of data received from a host device, such as a host computer, (not shown) that is connected by a communication network and the like.

The command/image processing part 202 generates image data based on the data received from the host interface part 201 and outputs the image data to an LED head interface part 203. The LED head interface part 203 causes the LED heads 103K, 103Y, 103M and 103C to emit light using head drive pulses and the like controlled by a printer engine controller 204.

The printer engine controller 204 outputs control values for a charging bias, a development bias, a transfer bias and the like to a high voltage controller 206. The high voltage controller 206 outputs signals to a charging bias generation part 207, a development/supply bias generation part 208 and a transfer bias generation part 209 based on the inputted control values.

The charging bias generation part 207 and the development/supply bias generation part 208 apply a bias voltage to the charging rollers 105K, 105Y, 105M and 105C, the supply rollers 106K, 106Y, 106M and 106C and the development rollers 107K, 107Y, 107M and 107C of the respective black development unit 102K, yellow development unit 102Y, magenta development unit 102M and cyan development unit 102C. In addition, the transfer bias generation part 209 applies a bias voltage to the transfer rollers 111K, 111Y, 111M and 111C.

The sheet detection sensor 122 is used to adjust a timing for the transfer bias generation part 209 to apply the bias voltage to the transfer rollers 111K, 111Y, 111M and 111C and a timing for the printer engine controller 204 to cause the LED heads 103K, 103Y, 103M and 103C to emit light.

The printer engine controller 204 drives, at predetermined timings, a sheet supply motor 210 that rotates and drives the sheet supply roller, a carrying motor 211 that rotates and drives the registration rollers and the like, a transfer belt drive motor 212 that rotates and drives the transfer belt drive roller, a fuser drive motor 213 that rotates and drives the fusion rollers, and photosensitive drum drive motors (for K, Y, M and C, respectively) 214 that rotate and drive the respective photosensitive drums. A temperature of A fuser heater 217 of the fuser 123 is controlled by the printer engine controller 204 in response to a detection value of a thermister 216.

Figure 1:
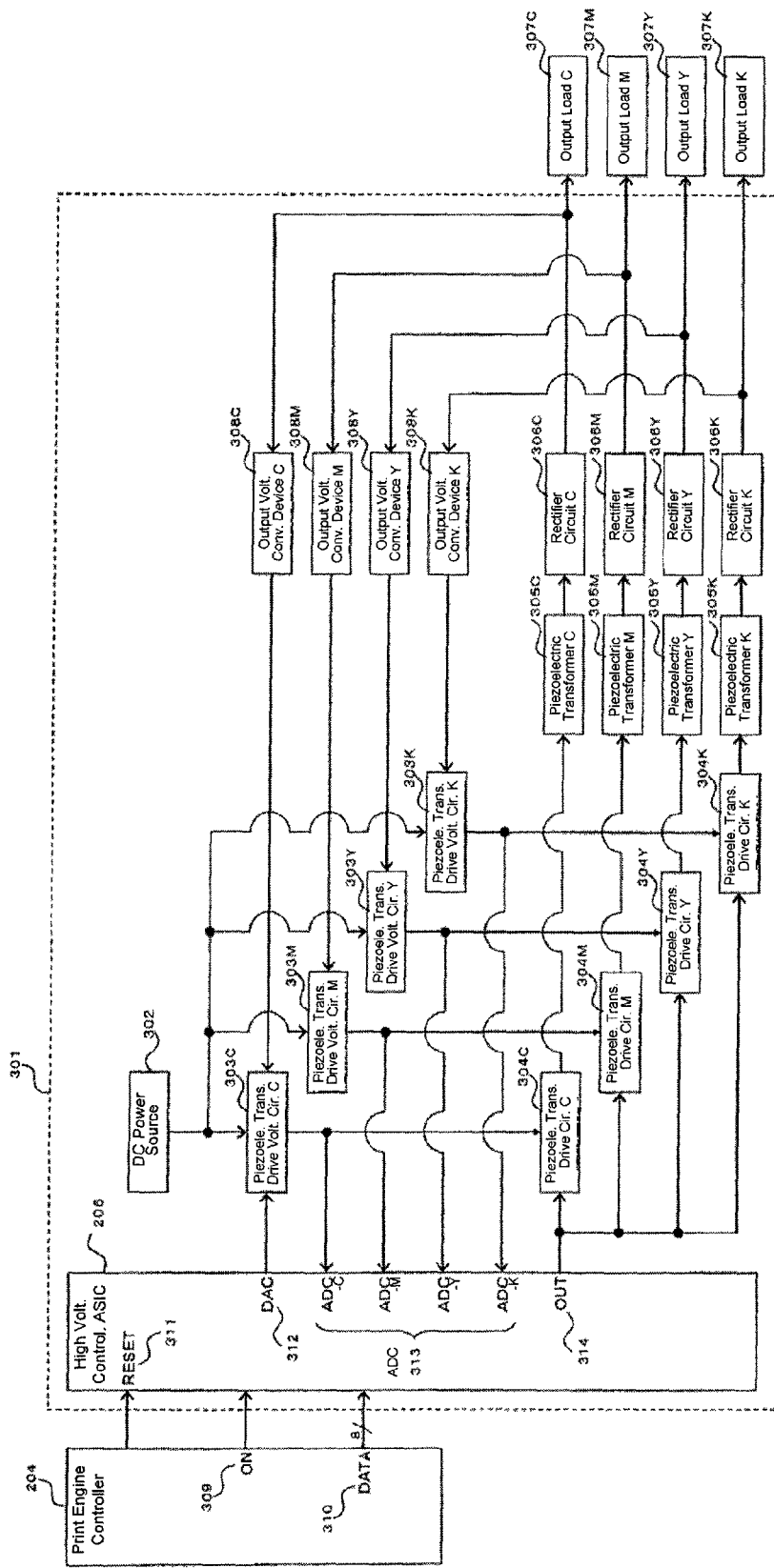
FIG. 1 is a block diagram illustrating a configuration of a high voltage power source device according to a first embodiment.

FIG. 1 is a block diagram illustrating a configuration of the high voltage power source device according to the first embodiment. In FIG. 1, the high voltage power source device 301 corresponds to the charging bias generation part 207 shown in FIG. 3. Symbols K, Y, M and C in the figure indicate high voltage output channels. The four channels have the same configuration unless otherwise specially noted. Therefore, the below explanation is for a single channel and omits the symbols K, Y, M and C.

The high voltage power source device 301 is connected to the printer engine controller 204 and includes a high voltage controller ASIC (application specification integrated circuit) 206 that outputs a piezoelectric transformer control signal in accordance with a signal outputted from the printer engine controller 204. The present embodiment is explained with a case where the high voltage controller ASIC 206 is provided inside the high voltage power source device 301. However, the high voltage controller ASIC 206 may be provided inside a large scale integration circuit (LSI) in the printer engine controller 204. In addition, the present embodiment uses an ASIC. However, the present embodiment is not limited to the ASIC but may use a device provided with a central processing unit (CPU), such as a microprocessor and the like, built therein, or a field programmable gate array (FPGA) or the like.

Reference numeral 305 is a piezoelectric transformer (PZT) that steps up a voltage using a resonance phenomenon by a piezoelectric transducer, such as ceramics and the like. Reference numeral 302 is a direct current (DC) power source that is common for each channel. Reference numeral 303 is a piezoelectric transformer drive voltage circuit that generates a voltage inputted from the DC power source 302 to the primary side of the piezoelectric transformer 305. Reference numeral 304 is a piezoelectric transformer drive circuit that uses a switching element. Reference numeral 306 is a rectifier circuit that converts a high voltage alternating current (AC) output that is outputted from the secondary side of the piezoelectric transformer 305 to a negative DC output. As described above, the high voltage power source device 301 includes a plurality of piezoelectric transformers 305 that each form a primary electrode and a secondary electrode on the piezoelectric ceramics, that each receive a primary voltage at the primary electrode and generate a secondary voltage from the secondary electrode.

Reference numeral 307 is an output load that corresponds to a charging device. Reference numeral 308 is an output voltage conversion device that converts the negative voltage (high voltage), which is the secondary output of the piezoelectric transformer 305 to 0 to 3.3 V. Reference numeral 310 is a DATA signal that outputs 8-bit data that corresponds to the voltage value of the secondary side output of the piezoelectric transformer 305 from the printer engine controller 204 to the high voltage controller ASIC 206.

Reference numeral 311 is a RESET signal that initializes the high voltage controller ASIC 206. Reference numeral 309 is an ON signal that outputs a bias voltage to the high voltage controller ASIC 206. Reference numeral 314 is an OUT signal that drives the piezoelectric transformer drive circuits 304C, 304M, 304Y and 304K. Reference numeral 312 is a digital-analog converter (DAC; output port) that outputs 0 to 3.3 V to the DATA 310. Reference numeral 313 is an analog-digital converter (ADC; input port) that inputs a piezoelectric transformer input voltage that is outputted from the piezoelectric transformer drive voltage circuits 303C, 303M, 303Y and 303K.

Figure 8:
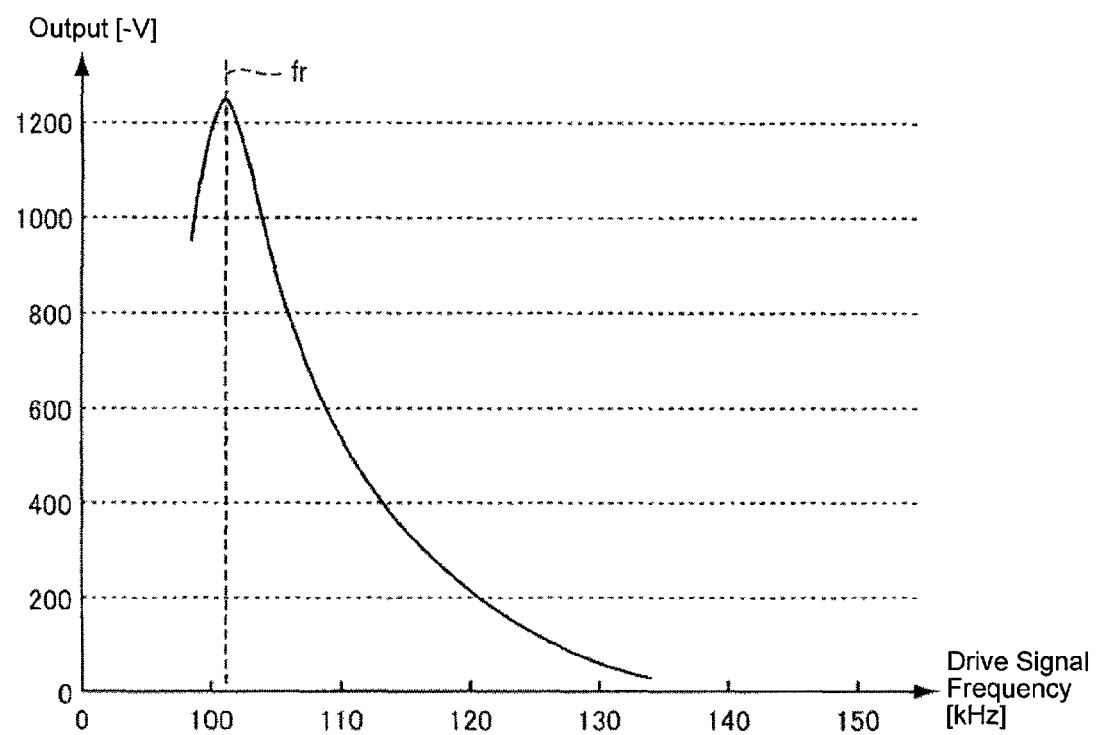
FIG. 8 is a graph illustrating an input/output characteristic of the piezoelectric transformer according to the first embodiment.

FIG. 8 is a graph illustrating an input/output characteristic of the piezoelectric transformer according to the first embodiment and show a relationship between an input drive signal frequency [kHz] and out [-V] of the piezoelectric transformer 305. In FIG. 8, a symbol "fr" indicates a resonance frequency of the piezoelectric transformer 305. The output voltage value in FIG. 8 is an example. Various output voltage values are obtained by changing a circuit constant for the piezoelectric transformer drive circuit 304 and may change depending on a size of the load.

Figure 4:
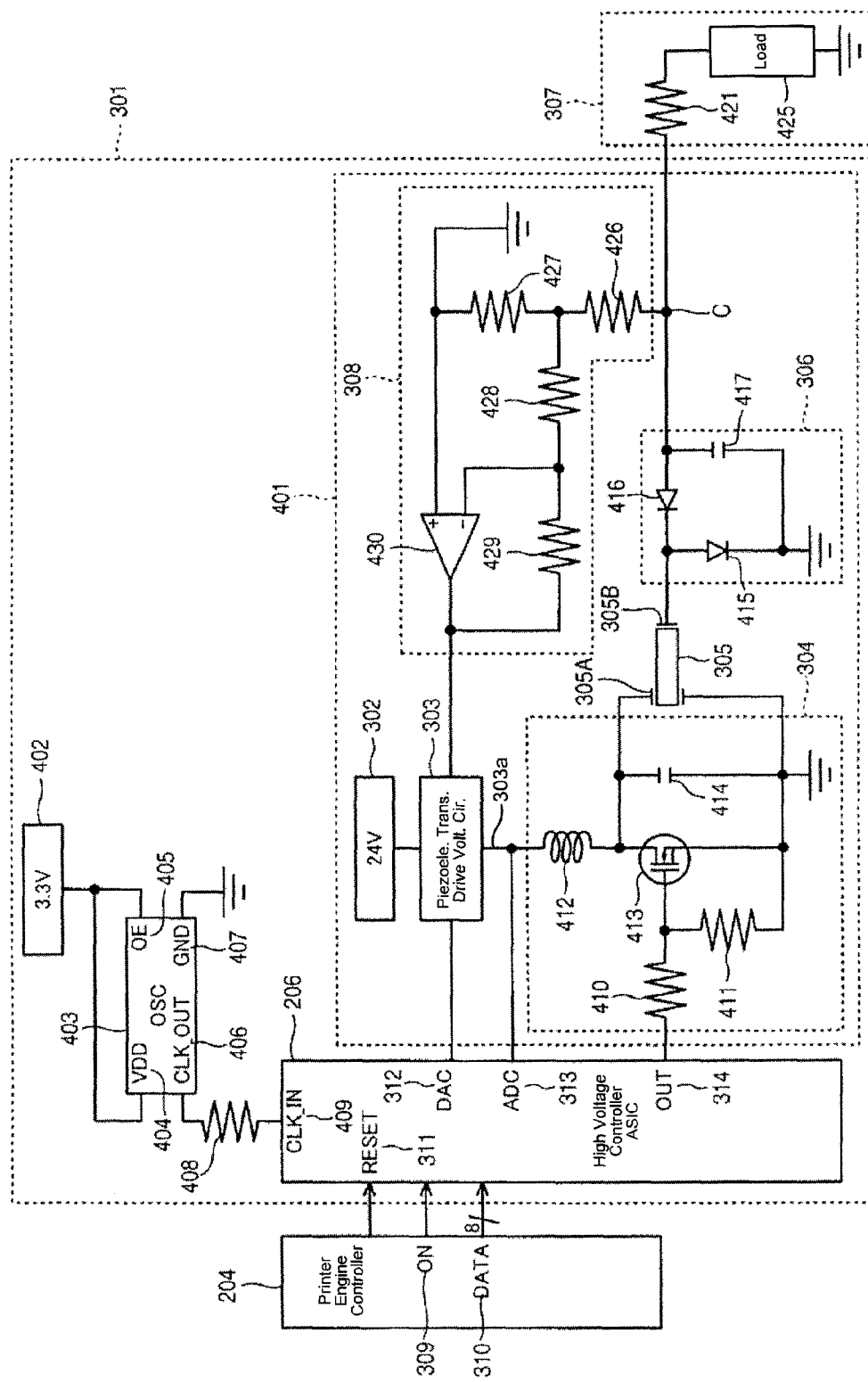
FIG. 4 is an explanatory diagram illustrating a circuit configuration of the high voltage power source device according to the first embodiment.

FIG. 4 is an explanatory diagram illustrating a circuit configuration of the high voltage power source device according to the first embodiment. The four channels K, Y, M and C have the same configuration. Therefore, a single channel is explained, and the symbols K, Y, M and C are omitted. In addition, the parts that are the same as those shown in FIG. 1 are indicated by the same symbols. In FIG. 4, reference numeral 301 is the high voltage power source device. Reference numeral 305 is the piezoelectric transformer. The part indicated by reference numeral 305A in the figure is the primary side input terminal. The stepped-up output is outputted from the secondary side output terminal indicated by reference numeral 305B in the figure by applying a piezoelectric transformer driver signal to the input terminal 305A.

Reference numeral 306 is the rectifying circuit that converts the secondary AC output of the piezoelectric transformer 305 to a negative DC output. Reference numeral 302 is a 24-V DC power source, which is supplied from a low voltage power source device (not shown) by rectifying an AC 100 V supplied from a commercial power source. Reference numeral 303 is the piezoelectric transformer drive voltage circuit, which will be described in detail later.

Reference numeral 304 is the piezoelectric transformer drive circuit as a primary voltage supply device that drives the piezoelectric transformer 305. Reference numeral 403 is an oscillator (OSC) that outputs a reference clock 50 MHz for the high voltage controller ASIC 206. Reference numeral 204 is the printer engine controller. Reference numeral 308 is an output voltage conversion device that divides, and reverses polarity of, the output from the rectifying circuit 306.

A circuit that is configured from the above-described DC power source 302, piezoelectric transformer drive voltage circuit 303, piezoelectric transformer drive circuit 304, piezoelectric transformer 305, rectifying circuit 306 and output voltage conversion device 308 forms a charging high voltage circuit 401.

A load 307 is an output load of the charging device and is connected to the charging roller 425, which is a charging load, through a resistor 421. The DAC 312 and the OUT 314 form output ports of the high voltage controller ASIC 206. The ADC 313 forms an analog input port of the high voltage controller ASIC 206. The ON 309, the DATA 310 and the RESET 311 form an input from the printer engine controller 204.

Power for the oscillator 403 is supplied from the 3.3-V power source 402, and a voltage is applied to a VDD 404 and an output enable terminal OE 405. A GND terminal 407 is connected to a ground, and a CLK_OUT terminal 406 is connected to a CLK_IN terminal 409 of the high voltage controller ASIC 206 and supplies a 50-MHz clock signal.

The high voltage controller ASIC 206 operates by synchronizing to the clock signal inputted from the CLK_IN terminal 409. The OUT 314 is an output port that outputs the piezoelectric transformer drive pulse to the piezoelectric transformer drive circuit 304. The high voltage controller ASIC 206 is connected to the printer engine controller 204 by three signal lines; RESET 311, ON 309 and DATA 310.

The piezoelectric transformer drive circuit 304 is configured from resistors 410 and 411, an inductor 412, an N channel power metal oxide silicon field effect transistor (MOSFET) 413 (hereinafter referred to as "FET 413") and a capacitor 414. The piezoelectric transformer drive pulse OUT 314 is inputted to a gate of the FET 413.

The inductor 412 and the capacitor 414 form an LC resonance circuit and apply a half-sine wave to the primary side (input side) 305A of the piezoelectric transformer 305. A peak value of the inputted half-sine wave depends on the output of the piezoelectric transformer drive voltage circuit 303. However, a circuit constant is adjusted so that a peak voltage at the time of outputting a target voltage becomes approximately 100 V.

A step-up ratio output that corresponds to a switching frequency of the FET 413, that is, a frequency of the OUT 314, is obtained at the secondary side 305B of the piezoelectric transformer 305. As shown in FIG. 8, an output characteristic of the secondary side 305B of the piezoelectric transformer 305 varies depending on a drive signal frequency for the OUT 314. The step-up ratio is determined by the combination of the switching frequency and load of the FET 413.

The output control of the piezoelectric transformer 305 is performed as follows. The drive is started at a high frequency. Then, the output is increased by lowering the drive signal frequency. The drive signal frequency is locked at a point near the target voltage, that is, where the drive signal frequency reaches near the resonance frequency. A constant voltage control is performed by operation of the piezoelectric transformer drive voltage circuit 303 thereafter. The rectifying circuit 306 is configured from diodes 415 and 416 and a capacitor 417 and converts an AC high voltage output that is outputted from the piezoelectric transformer 305 into a negative DC high voltage output.

An output voltage conversion device 308 divides the high voltage output using the resistors 426 and 427. The divided negative voltage is converted to 0 to 3.3 V by the resistors 428 and 429 and a repeat amplifier configured from an operational amplifier 430 connected to the 24-V DC voltage (not shown) and is inputted to the piezoelectric transformer drive voltage circuit 303. Here, the resistor 426 is configured to 100 MΩ, the resistors 427 and 428 are each configured to 100 kΩ, and the resistor 429 is configured to 330 kΩ, as examples.

Figure 5:
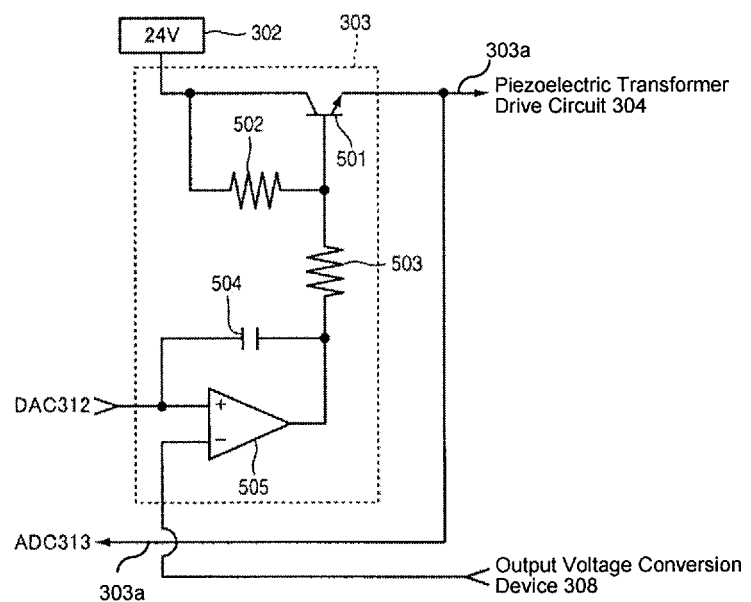
FIG. 5 is an explanatory diagram illustrating a configuration of a piezoelectric transformer voltage circuit according to the first embodiment.

FIG. 5 is an explanatory diagram illustrating a configuration of a piezoelectric transformer voltage circuit according to the first embodiment. In FIG. 5, the piezoelectric transformer drive voltage circuit 303 receives inputs from the 24-V DC power source 302, from the output of the DAC 312 of the high voltage controller ASIC 206, the output of the output voltage conversion device 308 (secondary voltage output). In addition, the piezoelectric transformer drive voltage circuit 303 provides outputs to the input of the piezoelectric transformer drive circuit 304 and the input of the ADC 313 of the high voltage controller ASIC 206. Therefore, the piezoelectric transformer drive voltage circuit 303 includes a voltage detection device that detects the secondary voltage output.

The piezoelectric transfer drive voltage circuit 303 is a dropper circuit, and is configured from an NPN transistor 501, resistors 502 and 503, a capacitor 504, and an operational amplifier 505 connected to the 24-V DC power source (not shown).

Figure 6:
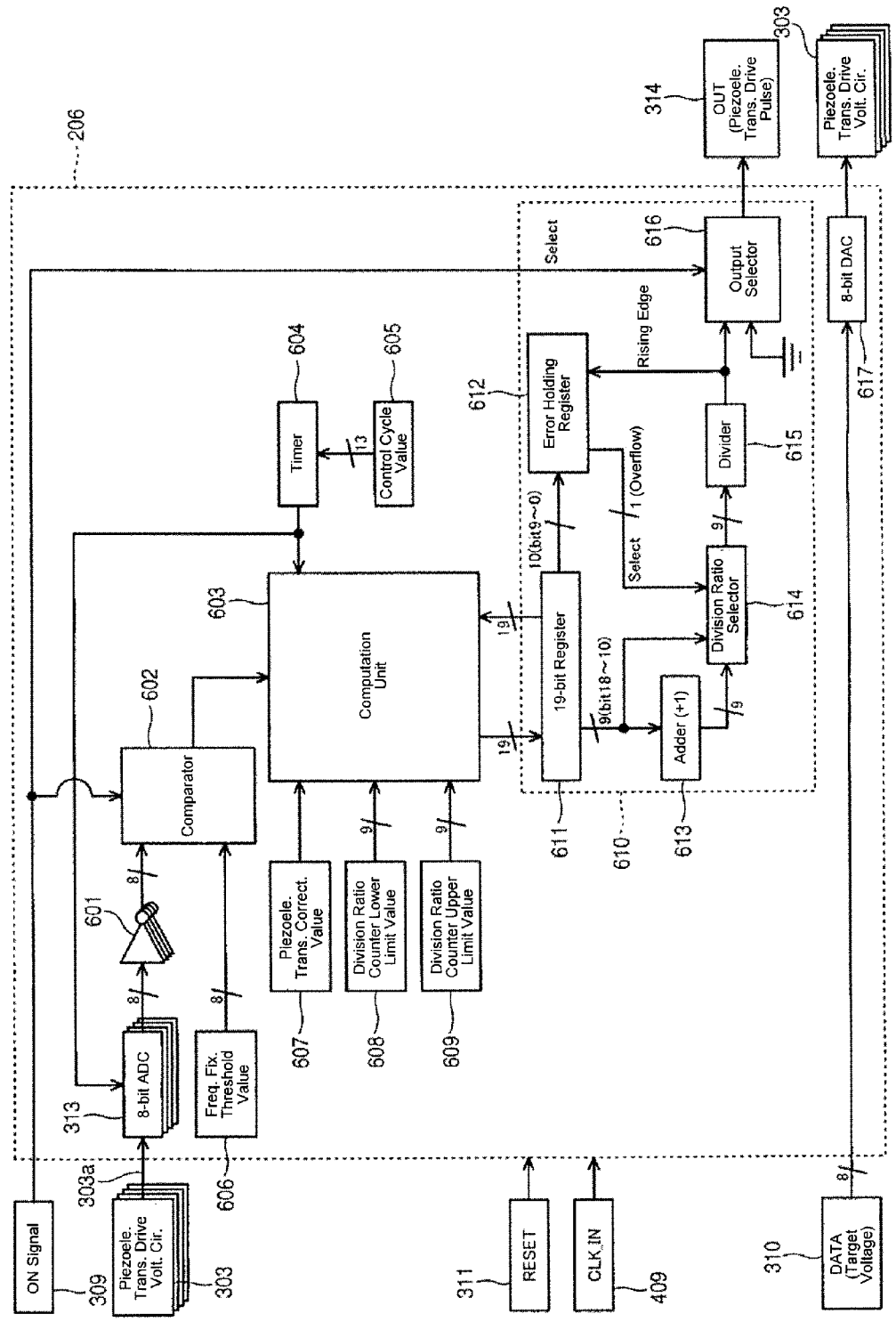
FIG. 6 is a block diagram illustrating a circuit configuration of a high voltage controller application specification integrated circuit (ASIC) according to the first embodiment.

FIG. 6 is a block diagram illustrating a circuit configuration of a high voltage controller application specification integrated circuit (ASIC) according to the first embodiment. In FIG. 6, a circuit of the high voltage controller ASIC 206 as a single frequency setting device is written by a logic description language or the like and forms an application specification integrated circuit. In the figure, parts required to be provided in four channels for respective colors are shown with four layers.

Reference numeral 311 is a RESET signal from the printer engine controller 204 shown in FIG. 4. Reference numeral 409 is a clock signal CLK_IN from the oscillator 403 shown in FIG. 4. Reference numeral 309 is a high voltage output ON signal from the printer engine controller 204 shown in FIG. 4. Reference numeral 303a is a piezoelectric transformer primary side input voltage outputted from the piezoelectric transformer drive voltage circuit 303. Reference numeral 310 is a target voltage value for the high voltage output and is an 8-bit value each. Reference numeral 314 is a pulse output and is a piezoelectric transformer drive pulse signal to be outputted to the piezoelectric transformer drive circuit 304.

An ADC 313 is an analog-digital converter that converts the piezoelectric transformer primary side input voltage 303a (0 to 24 V) applied from the piezoelectric transformer drive voltage circuit 303 to the piezoelectric transformer drive circuit 304, to an 8-bit digital value. Output voltages of the piezoelectric transformer drive voltage circuits 303C, 303M, 303Y and 303K are inputted respectively to ADC_C, ADC_M, ADC_Y and ADC_K of the ADC 313. The voltages inputted to ADC_C, ADC_M, ADC_Y and ADC_K are digitally converted and outputted as 8-bit digital values. In addition, reference numeral 601 is an 8-bit output inverter that inverts "1" and "0" of the input data to output.

A timer 604 refers to a value 7000 (1B58h (hexadecimal, same below)) stored in a control cycle value 605 and subtracts an internal 13-bit counter from the value (1B58h) stored in the control cycle value 605 to 1B58h, 1B57h, 1B56h,···0003h, 0002h, 0001h, 0000h. When the value reaches 0000h, the initial value 1B58h is loaded, and the above-described subtraction is repeated. Such timer 604 counts CLK_IN 409 (50 MHz or 20 ns cycle clock) by subtracting the value stored in the control cycle value 605 and outputs a 140 μs cycle pulse.

The outputted pulse is inputted to a computation unit 603 and the 8-bit ADC 313 and becomes a trigger signal for starting the computation and analog-digital (AD) conversion. The frequency fixing threshold value 606 as a drive frequency fixing threshold value is stored in advance as a threshold value that indicates that the high voltage output has reached near the target value. The threshold value is compared at a comparator 602 with the respective outputs from the inverter 601 for the four channels.

The piezoelectric transformer correction value 607 is a value that corrects a manufacturing fluctuation of each piezoelectric transformer and is a value that is written and saved at the time of manufacturing and shipping the image forming apparatus according to the present embodiment. The computation unit 603 performs computation in response to the 2-bit value inputted from the comparator 602 and updates a 19-bit register 611 as follows:

(1) The value of the 19-bit register 611 is added by "1" when the output of the comparator 602 is 00b (binary; same below); (2) The value of the 19-bit register 611 is not updated when the output of the comparator 602 is 01b; and (3) The value of the 19-bit register 611 is subtracted by "1" when the output of the comparator 602 is 10b.

Although detailed operation of the comparator 602 is described later, the comparator 602 compares the value of the output value of the 8-bit ADC 313 as inverted by the inverter 601 and the frequency fixing threshold value 606 and outputs one of 00b, 01b and 10b. A value 10b is outputted when the high voltage output ON signal 309 is at a low level. When the RESET signal 311 is inputted, the higher 9 bits and the lower 10 bits of the 19-bit register 611 are initialized as a division ratio counter lower limit value 608 and 000h, respectively.

In addition, when the 19-bit register 611 is updated by the above-described addition to and subtraction from the 19-bit register 611, the division ratio counter lower limit value 608 and a division ratio counter upper value 609 are compared. (1) When the 19-bit register 611<{higher 9 bits being the division ratio counter lower limit value 608, and the lower 10 bits being 000h}, the updated value of the 19-bit register 611 is set to {higher 9 bits being the division ratio counter lower limit value 608, and the lower 10 bits being 000h}. (2) When the 19-bit register 611>{higher 9 bits being the division ratio counter upper limit value 609, and the lower 10 bits being 000h}, the updated value of the 19-bit register 611 is set to {higher 9 bits being the division ratio counter upper limit value 609, and the lower 10 bits being 000h}.

The 19-bit register 611 is a register, a value of which is updated by the computation unit 603 and which maintains the division ratio value. The higher 9 bits (bits 18-10) indicate an integer value of the division ratio, and the lower 10 bits (bits 9-0) indicate a fractional value that corresponds to "value/

1024." The lower 10 bits of the 19-bit register 611 are outputted to an error holding register 612, and the higher 9 bits are outputted to an adder (+1) 613 and a division ratio selector 614.

The error holding register 612, to which the lower 10 bits of the 19-bit register 611 are inputted, updates the value held in the register by adding the lower 10-bit value to a 10-bit value held in the register at each rising edge of the piezoelectric transformer drive pulse outputted from a divider 615. The error holding register 612 outputs a High signal to the division ratio selector 614 if the register overflows at the time of the addition and outputs a Low signal to the division selector 614 if the overflow does not occur.

The adder (+1) 613 outputs to the division ratio selector 614 a 9-bit value, which is the 9-bit value inputted from the 19-bit register 611 that is added by "1". The lower 9 bits of the 19-bit register 611 and the 9-bit value of the adder (+1) 613 are inputted to the division ratio selector 614. The division ratio selector 614 outputs the input from the adder 613 to the divider 615 when a Select (overflow) signal outputted from the error holding register 612 is High and outputs the input from the 19-bit register 611 to the divider 615 when the select (overflow) signal is Low.

The divider 615 counts the 9-bit value inputted from the division ratio selector 614 and outputs an output selector 616 a pulse of ON duty of 30% at a cycle of (9 bit×10 ns) (cycle of CLK_IN signal 409). In addition, a value of the ON duty of 30% is a sum of a 1/4 value, a 1/32 value and a 1/64 value of the 9-bit value inputted from the division ratio selector 614, that is, a sum of values of the 9-bit output of the division selector 614 as shifted to the right by 2, 5 and 6 bits, respectively.

A binary pulse output generation part 610 is configured from the 19-bit register 611, the error holding register 612, the adder (+1) 613, the division ratio selector 614, the divider 615 and the output selector 616. The binary pulse output generation part 610 sets frequencies of the piezoelectric transformer drive pulse outputted to the piezoelectric transformer drive circuit as the same frequency and outputs the piezoelectric transformer drive pulse from the output selector 616.

Operation of the above-described configuration is explained. Operation of the entire image forming apparatus is explained based on FIGS. 2 and 3. Print data described by a page description language (PDL) or the like is inputted from an external device (not shown) to the image forming apparatus 101 via the host interface part 201.

The inputted print data is converted to bitmap data by the command/image processing part 202. The image forming apparatus 101 starts print operation after raising the heat fusion rollers 124 and 125 of the fuser 123 to the predetermined temperature by controlling the fuser heater 217 in response to a detection value of the thermister 216.

The sheet accommodated in the sheet supply cassette 117 is supplied by the sheet supply roller 118 driven by the sheet supply motor 210. The sheet is carried along the sheet guide 119 and contacts the registration rollers 120 and 121 in stop. After correcting the skew, the driving of the carrying motor 211 is started at a timing synchronized to the below-described image forming operation, and thereby the sheet is carried onto the transfer belt 114 by the registration rollers 120 and 121.

The development units 102K, 102Y, 102M and 102C form toner images on the photosensitive drums 109K, 109Y, 109M and 109C in the respective development units by the electrographic process. At this time, the LED heads 103Y, 103Y, 103M and 103C are turned on in response to the bitmap data generated by the command/image processing part 202. The toner images developed by the development units 102K, 102Y, 102M and 102C are transferred to the sheet carried on the transfer belt 114 by a transfer bias voltage applied to the transfer rollers 111K, 111Y, 111M and 111C.

After forming a four-color toner image on the sheet, the toner image is fixed to the sheet by heat and pressure using the fuser 123. The sheet is carried along the sheet guide 128, and ejected, by the ejection rollers 126 and 127. The toner cartridges 104K, 104Y, 104M and 104C have a configuration that the toner cartridges 104K, 104Y, 104M and 104C are removable from the development units 102K, 102Y, 102M and 102C and that the toner inside is supplied to the corresponding development unit 102.

Next, operation of the high voltage power source device 301 is explained based on FIG. 1 and with reference to FIG. 3. The printer engine controller 204 starts applying the charging bias voltage when the photosensitive drum 109 is rotated and driven by the photosensitive drum drive motor 214 and reaches to the predetermined rotational speed.

The application of the charging bias voltage is maintained until the rotation of the photosensitive drum 109 is stopped after the print operation by the image forming apparatus 101 is completed. For the application of the charging bias voltage, the printer engine controller 204 outputs the RESET signal 311 at the Low level to the high voltage controller ASIC 206 to initialize various setting in the high voltage controller ASIC 206.

Next, the printer engine controller 204 outputs, from a signal line of the DATA 310, an 8-bit value that corresponds to the target voltage value for the high voltage output. The 8-bit value of the DATA 310 and the output voltage have a relationship shown by "DAC set value (8-bit)" and "Output value" shown in FIG. 10. The 8-bit value of the DAC set value is 65h to 98h for the output of a set range of the −800 V to −1200 V.

The printer engine controller 204 turns the ON signal 309 from Low to High at the timing to apply the charging bias voltage after outputting the DATA 310 that is the target voltage value. The high voltage controller ASIC 206 outputs the piezoelectric transformer drive pulse from the output port of OUT 314 to the piezoelectric transformer drive circuit 304 immediately after the input of the ON signal 309 turns to High.

Figure 7:
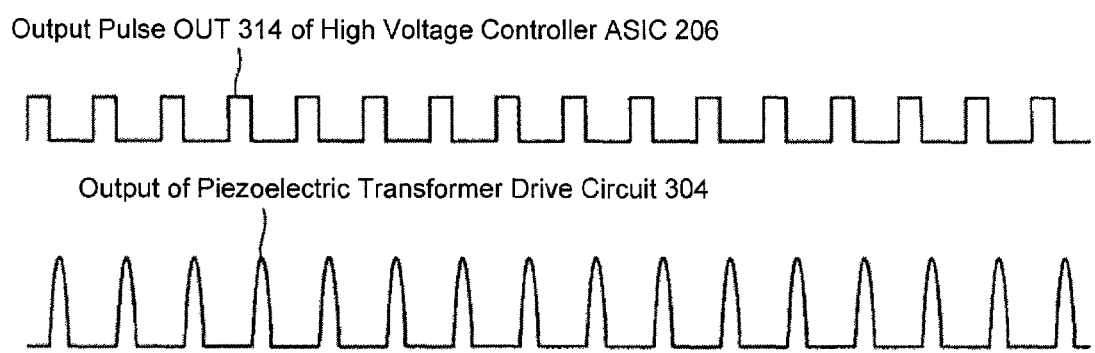
FIG. 7 is an explanatory diagram illustrating a drive pulse and a piezoelectric transformer primary side input waveform according to the first embodiment.

The piezoelectric transformer drive circuit 304 applies a half-sine wave voltage to the primary side of the piezoelectric transformer 305 by switching the DC voltage supplied from the piezoelectric transformer drive voltage circuit 303. FIG. 7 is an explanatory diagram illustrating a drive pulse and a piezoelectric transformer primary side input waveform according to the first embodiment. FIG. 7 shows waveforms of the output pulse OUT 314 of the high voltage controller ASIC 206 and the output (piezoelectric transformer primary side input) of the piezoelectric transformer drive circuit 304 at the time of outputting the target voltage.

The output of the piezoelectric transformer drive circuit 304 is inputted to the primary side of the piezoelectric transformer 305. A voltage that is stepped up in response to the drive frequency is outputted from the secondary side of the piezoelectric transformer 305. The rectifier circuit 306 is configured from a diode and a capacitor and outputs a negative bias voltage.

The output voltage conversion device 308 converts the DC high voltage, which is the output of the rectifier circuit 306, to a voltage in a range of 0 to 3.3 V and outputs the converted voltage to the piezoelectric transformer drive voltage circuit 303. The ADC 313 is an analogue-digital converter that converts a voltage of 0 to 24 V, which is an input voltage of the piezoelectric transformer drive circuit 304, into an 8-bit digital value. In the case of voltage being 16 to 24 V, the converted value forms the values shown in FIG. 11.

Next, operation of the high voltage power source device 301 is explained in detail based on FIG. 4. The oscillator 403 inputs, to the CKL_IN 409 of the high voltage controller ASIC 206, an input of a 50 MHz clock signal, which is a reference clock. The high voltage controller ASIC 206 initializes various settings when the RESET signal 311 inputted from the printer engine controller 204 is turned to Low.

Next, the high voltage controller ASIC 206 outputs, from the output port of the OUT 314, a pulse (ON duty of 30%) of a piezoelectric transformer drive frequency, which is an initial value, when the high voltage output ON signal 309 outputted from the printer engine controller 204 is turned from Low to High. The initial value of the piezoelectric transformer drive frequency is 130 kHz.

The pulse outputted from the OUT 314 is applied to a gate of the FET 413 of the piezoelectric transformer drive circuit 304. By turning on and off the gate of the FET 413, the resonance circuit, which is configured by the output of the piezoelectric transformer drive voltage circuit 303, the inductor 412, the capacitor 414 and the piezoelectric transformer 305, is driven, and thus, the half-sine wave voltage shown in FIG. 7 is applied to the primary side terminal 305A of the piezoelectric transformer 305.

The AC output from the secondary side terminal 305B of the piezoelectric transformer 305 is rectified to the negative bias voltage by the diodes 415 and 416 and the capacitor 417. The outputted bias voltage is outputted to the charging load 425 through the resistor 421 of the output load 307. The register 421 is connected to the charging load 425 via a metal contact.

When the development unit 102 shown in FIG. 2, which becomes the load, is not installed to the image forming apparatus 101, becomes a load-free state beyond the register 421. However, because the print operation cannot be performed in this state, the image forming apparatus 101 displays an error on an operation panel or the like (not shown).

An output conversion device 308 divides the high voltage output (voltage at point C in FIG. 4) to ½000 using a 100 MΩ resistor 426 and 100 kΩ resistors 427 and 428 and outputs the divided voltage after amplifying the voltage by 3.3 times using the inversion amplifier configured from the resistor 428, a 330 kΩ resistor 429 and an operational amplifier 430. The voltage at point C in FIG. 4 and the output of the operational amplifier 430 form the relationship of "output voltage" and "inversion amplifier output voltage" shown in FIG. 10.

The printer engine controller 204 sets the 8-bit value of the DATA 310 to a value that corresponds to the target voltage value of the high voltage output. The 8-bit value of the DATA 310 is 65h to 98h indicated under "DAC set value (8-bit)" shown in FIG. 10, and a set range of the target voltage value is −800 V to −1200 V. In the present embodiment, the target voltage value is −1100V, that is, the DAC set value (8-bit) is 8Ch.

The high voltage controller ASIC 206 outputs the piezoelectric transformer drive pulse from the output port of the OUT 314 to the piezoelectric transformer drive circuit 304 when the input of ON signal 309 is turned to High. The drive frequency of the piezoelectric transformer 305 is gradually shifted from a high frequency to a low frequency. The high voltage controller ASIC 206 fixes the drive frequency when the output voltage reaches near the target voltage and when the input voltage from the piezoelectric transformer driver voltage circuit 303 is turned equal to or below the frequency fixing threshold value 606.

Next, operation of the piezoelectric transformer drive voltage circuit 303 is explained based on FIG. 5. The piezoelectric transformer drive voltage circuit 303 is a dropper circuit. The basic operation is briefly explained, as it is well known. The inputs to the piezoelectric transformer drive voltage circuit 303 are the voltage that is the DATA 310 shown in FIG. 4, which is the target voltage, as being digital-analog-converted by the DAC 312, and the output voltage from the output voltage conversion device 308.

Figure 9:
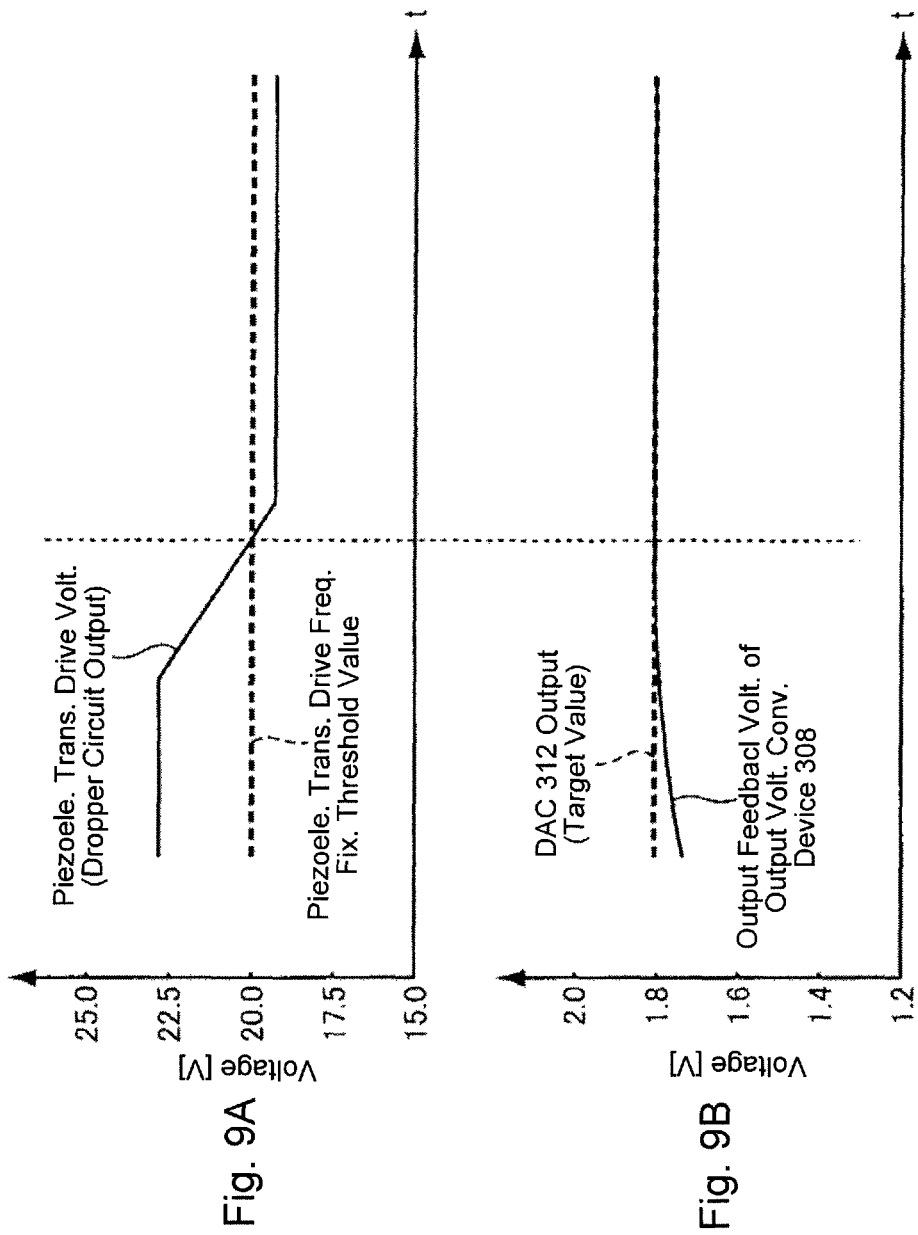
FIGS. 9A and 9B are explanatory diagrams illustrating relationships between an output feedback voltage and a piezoelectric transformer input voltage according to the first embodiment.

FIGS. 9A and 9B are explanatory diagrams illustrating relationships between an output feedback voltage and a piezoelectric transformer input voltage according to the first embodiment. In FIG. 9B, the solid line indicates the output voltage (output feedback voltage) from the output voltage conversion device 308, which is the input of the piezoelectric transformer drive voltage circuit 303, and the broken line indicates the output (target value) from the DAC 312. In FIG. 9A, the solid line indicates the piezoelectric transformer drive voltage, which is the output of the piezoelectric transformer drive voltage circuit 303, and the broken line indicates the piezoelectric transformer drive frequency fixing threshold value (frequency fixing threshold value 606 shown in FIG. 6). The horizontal axis in FIGS. 9A and 9B indicates time (t).

In FIG. 9A, because the dropper circuit does not operate at the beginning of the voltage output, the output to the piezoelectric transformer drive circuit 304 is over 22 V. However, the dropper circuit operates when the output reaches near the target voltage (e.g., −1045 V, which is −5% of the target voltage), that is, when the output of DAC 312 approaches the output (output of secondary voltage) of the output conversion device 308, causing the output to the piezoelectric transformer drive circuit 304 to fall below 20V. As described later, 20.0 V is the frequency fixing threshold value 606 (shown in FIG. 6) of the piezoelectric transformer 305 in the present embodiment. This value is 2Bh in the digital value (8-bit) according to the chart shown in FIG. 11.

The output of the frequency fixing threshold value 606 shown in FIG. 6 and the output of the dropper circuit, that is, the output (8-bit) of the ADC 313, which is the analog-digital-converted output of the piezoelectric transformer drive voltage circuit 303, are compared by the comparator 602 shown in FIG. 6.

Next, operation of the high voltage controller ASIC 206 is explained based on FIG. 6. The image forming apparatus of the present embodiment is configured by four colors; black (K), yellow (Y), magenta (M) and cyan (C). In FIG. 6, the part that is configured by units for the respective colors is indicated by a 4-layer block, and the unit that is used commonly by the four colors is indicated by a single-layer block.

The internal circuit of the high voltage controller ASIC 206 operates by synchronizing with the 50 MHz $CLK_{13}$ IN signal 409. When the high voltage output ON signal 309 is turned from Low to High, the piezoelectric transformer drive pulse (OUT) 314 is outputted from the output selector 616.

The frequency of the piezoelectric drive pulse (OUT) 314 is 130 kHz as an initial drive frequency preset at the division ratio counter lower value 608. Thereafter, the computation unit 603 increases the value of the 19-bit register 611 (decreases the drive frequency) until the piezoelectric transformer drive frequency is fixed. In addition, by the binary pulse output generation part 610, a pulse is outputted from the divider 615 so as to be an average division value of a value {higher 9 bits+(lower 10-bit value/1024)} held in the 10-bit register 611. The upper value of the value of the 19-bit register 611 computed at the computation unit 603 is limited to the value read from the division value counter upper limit value 609.

Here, the computation unit 603 reads a value that corrects the manufacturing fluctuation of the piezoelectric transformer and the like from the piezoelectric transformer correction value 607 and reflects the value in the computation result. In the present embodiment, the piezoelectric transformer correction value 607 is zero for simplifying the explanation.

Operation of the high voltage controller ASIC 206 is explained in detail below. The printer engine controller 204 shown in FIG. 4 outputs the RESET signal 311 as being Low to the high voltage controller ASIC 206. When the RESET signal 311 is outputted as being Low, the computation unit 603 sets, at the 19-bit register 611, a 19-bit value configured from the 9-bit value set to the division ratio counter lower limit value 608 in the piezoelectric transformer 305 as the higher 9 bits and zeros in the entire lower 10 bits.

When the initial value of the piezoelectric transformer drive pulse frequency is 130 kHz, the division ratio counter lower limit value 608 is 180h (the frequency of the CLK_IN signal 409 is 50 MHz, and thus 1/((1/50 MHz)×180h))≈130 kHz). Therefore, the higher 9 bits of the value of the 19-bit register 611 are 180h, and the lower 10 bits are 00h, that is, the value is 60000h.

The 10 bits of the error holding register 612 are all cleared to 0. Before outputting the high voltage, the high voltage output ON signal 313 is Low. The output selector 616 always outputs the Low signal as the Low Select signal is inputted. Therefore, the piezoelectric transformer is not driven. The comparator 602 outputs a value 10b based on the input of the high voltage output ON signal 309 as being Low.

The computation unit 603 subtracts "1" from the value in the 10-bit register 611 because the output of the comparator 602 is 10b. However, the result of subtraction becomes less than the initial set value (lower limit value). The computation unit 603 compares the higher 9 bits of the result of subtraction and the 9 bits of the division ratio counter lower limit value 608. If the higher 9 bits of the result of subtraction is less than the division ratio counter lower limit value 608, the value of the 19-bit register 611 is set to {higher 9 bits being the 9 bits of the division ratio counter lower limit value 608 and lower 10 bits being 000h}. As a result, the value of the 19-bit register 611 remains as the division ratio counter lower limit value 608 while the high voltage output ON signal 306 is Low.

The higher 9 bits of the 19-bit register 611, that is, the integer value of the division ratio value, and the value of the integer value added by "1" by the adder (+1) 613 are inputted to the division ratio selector 614.

As described above, if the value of the higher 9 bits of the 19-bit register 611 is assumed to be an N, values of N and N+1 are inputted. By selecting the two values using the signal outputted from the error holding register 612 and by outputting, at the 1024 pulse cycle, N frequency divisions for M times and N+1 frequency divisions for (1024−M) times by the output pulse of the divider 615, the values are controlled to be {N×M+(N+1)×(1024−M)}/1024=the higher 9-bit value of 19-bit register 611+(the lower 10-bit value/1024).

The above-described process is taken if the value of the 19-bit register 611 does not change. If the value of the 19-bit register 611 changes, then the value falls below the 1024 pulse cycle accordingly. Nonetheless, the average value on the right side and the left side of the above equation for the unit time becomes equal.

Figure 12:
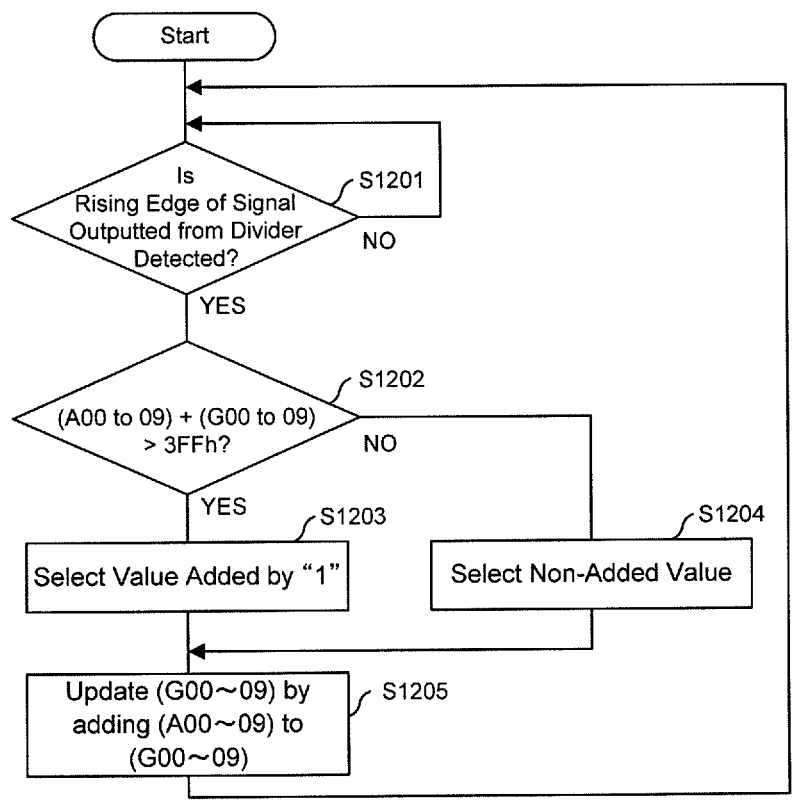
FIG. 12 is a flow diagram illustrating operation of an error holding register, an adder (+1) and a division ratio selector according to the first embodiment.

The operation of the error holding register 612 to which the lower 10 bits of the 19-bit register 611 is inputted, the adder (+1) 613, and the division ratio selector 614 is explained in accordance with the steps indicated by S in the flow diagram in FIG. 12 illustrating the operation of the error holding register, the adder (+1) and the division ratio selector according to the first embodiment, while referring to FIG. 6. The steps are explained using the flow diagram for simplification. However, in the actual circuit, the steps are realized by the hardware. The error holding register 612, the adder (+1) 613 and the division ratio selector 614 of the high voltage controller ASIC 206 start their operations.

S1201: Whether or not the error holding register 612 has detected a rising edge of the signal outputted from the divider 615 is determined. If so, the process moves to S1202. If not, the process stays at S1201 and continues to determine the detection of the rising edge of the signal.

S1202: The error holding register 612 that has detected the rising edge of the signal determines whether or not an added value of the lower 10-bit value (A00-09) of the 19-bit register 611 and the 10-bit value (G00-09) of the error holding register 612 is greater than 3FFh, that is, whether or not an overflow has occurred. If the occurrence of the overflow is determined, the process moves to S1203. If the occurrence of the overflow is not determined, the process moves to S1204.

S1203: The error holding register 612 that has determined the occurrence of the overflow outputs the Select signal as being High. The division ratio selector 614 to which the Select signal is inputted outputs to the divider 615 a 9-bit value ("Select value added by '1'") inputted from the adder (+1) 613. Then, the process moves to S1205.

S1204: The error holding register 612 that has determined that the overflow has not occurred outputs the Select signal as being Low. The division ratio selector 614 to which the Select signal is inputted outputs to the divider 615 a 9-bit value ("Select non-added value") inputted from the 19-bit register 611. Then, the process moves to S1205.

S1205: The error holding register 612 updates the 10-bit value (G00-09) of the error holding register 612 by adding the lower 10-bit value (A00-09) of the 19-bit register 611 to the 10-bit value (G00-09) of the error holding register 612. Then, the process moves to S1201. The error holding register 612, the adder (+1) 613 and the division ratio selector 614 operate as described above.

Returning to the explanation of FIG. 6, the 9-bit value of the division ratio counter lower limit value 608 is inputted the divider 615 at the initial state, and the divider 615 outputs the pulse of ON duty of 30%. At this time, the output of the divider 615 is only outputted to the error holding register 612 because the ON signal 313 is Low. In this case, the error holding register 612 holds 000h as the 10-bit value.

In addition, the output of the output voltage conversion device 308 shown in FIG. 4 is approximately 0 V under a high voltage output OFF state. At this time, the output of the piezoelectric transformer drive voltage circuit 303 is over 22 V (at the time when the dropper circuit is not operated).

Next, the printer engine controller 204 outputs to the DATA 310 an 8-bit value that corresponds to the target voltage. The correspondence of the target voltage and the 8-bit value is shown in the chart shown in FIG. 10. The 8-bit value (DAC set value) that corresponds to −1100 V, which is the target voltage according to the present embodiment, is 8Ch.

Next, the high voltage output ON signal 309 is turned from Low to High at a timing when the charging bias voltage is applied. When the high voltage output ON signal 309 is turned from Low to High, the Select signal is inputted as High to the output selector 616, and the piezoelectric transformer drive pulse 314 is outputted with the drive pulse frequency initial value of the piezoelectric transformer 305 shown in FIG. 4 being 130 kHz.

Moreover, to the comparator 602, 8 bits of the output of the inverter 601, which is an inverted value of the detection value of the 8-bit ADC 313, and 8 bits of the frequency fixing threshold value 606 of the piezoelectric transformer drive pulse are inputted when the high voltage output ON signal 309 is turned from Low to High. As described above, the frequency fixing threshold value 606 according to the present embodiment is 20 V, and the 8-bit value is 2Bh according to the chart shown in FIG. 11. The output immediately after starting the drive of the piezoelectric transformer is assumed 0 to 100 V. The output of the piezoelectric transformer drive voltage circuit 303 is over 22 V in all of the four channels. Therefore, the comparator 602 satisfies the below condition based on the chart shown in FIG. 11.

Output (16h) of inverter 601<Frequency fixing threshold value 606 (2Bh)

Figure 13:
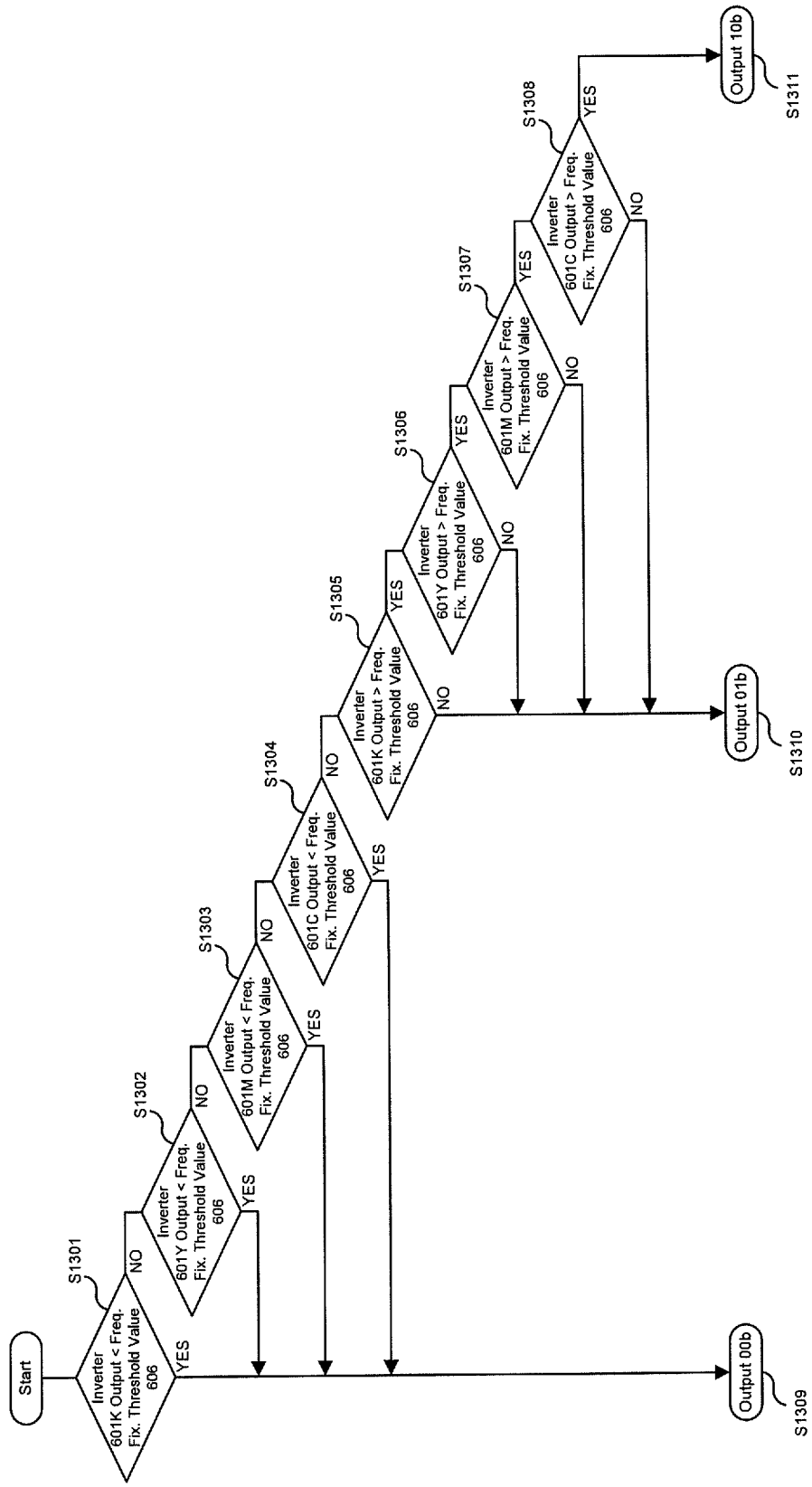
FIG. 13 is a flow diagram illustrating operation of a comparator according to the first embodiment.

Here, operation of the comparator 602 is explained in accordance to the steps indicated by S in the flow diagram in FIG. 13 illustrating the operation of the comparator according to the first embodiment, while referring to FIG. 6. The steps are explained using the flow diagram for simplification. However, in the actual circuit, the steps are realized by the hardware. In addition, in FIG. 13, the inverter to which a feedback voltage is inputted from the development unit 102K in the image forming unit 101 shown in FIG. 1 is indicated as an inverter 601K. Similarly, the inverters for the development units 102Y, 102M and 102C are respectively indicated as inverters 601Y, 601M and 601C. The comparator 602 starts its operation.

S1301: The comparator 602 determines whether or not the output of the inverter 601K is less than the frequency fixing threshold value 606. If the output is less than the frequency fixing threshold value 606, the process moves to S1309. If the output is equal to or greater than the frequency fixing threshold value 606, the process moves to S1302. S1302: The comparator 602 determines whether or not the output of the inverter 601Y is less than the frequency fixing threshold value 606. If the output is less than the frequency fixing threshold value 606, the process moves to S1309. If the output is equal to or greater than the frequency fixing threshold value 606, the process moves to S1303.

S1303: The comparator 602 determines whether or not the output of the inverter 601M is less than the frequency fixing threshold value 606. If the output is less than the frequency fixing threshold value 606, the process moves to S1309. If the output is equal to or greater than the frequency fixing threshold value 606, the process moves to S1304. S1304: The comparator 602 determines whether or not the output of the inverter 601C is less than the frequency fixing threshold value 606. If the output is less than the frequency fixing threshold value 606, the process moves to S1309. If the output is equal to or greater than the frequency fixing threshold value 606, the process moves to S1305.

S1305: The comparator 602 determines whether or not the output of the inverter 601K is greater than the frequency fixing threshold value 606. If the output is greater than the frequency fixing threshold value 606, the process moves to S1306. If the output is equal to the frequency fixing threshold value 606, the process moves to S1310. S1306: The comparator 602 determines whether or not the output of the inverter 601Y is greater than the frequency fixing threshold value 606. If the output is greater than the frequency fixing threshold value 606, the process moves to S130y. If the output is equal to the frequency fixing threshold value 606, the process moves to S1310.

S1307: The comparator 602 determines whether or not the output of the inverter 601M is greater than the frequency fixing threshold value 606. If the output is greater than the frequency fixing threshold value 606, the process moves to S1308. If the output is equal to the frequency fixing threshold value 606, the process moves to S1310. S1308: The comparator 602 determines whether or not the output of the inverter 601C is greater than the frequency fixing threshold value 606. If the output is greater than the frequency fixing threshold value 606, the process moves to S1311. If the output is equal to the frequency fixing threshold value 606, the process moves to S1310.

S1309: The comparator 602 outputs 00b as a 2-bit output and ends the process. S1310: The comparator 602 outputs 01b as a 2-bit output and ends the process. S1311: The comparator 602 outputs 10b as a 2-bit output and ends the process.

Returning to the explanation of FIG. 6, based on the above-described operation of the comparator 602, the comparator 602 outputs 00b as a 2-bit output to the computation unit 603 under the condition of Output (16h) of inverter 601<Frequency fixing threshold value 606 (2Bh) as described above. As a result, the computation unit 603 adds "1" to the value 60000h of the 19-bit register 611 to update to 60001h. As such, the piezoelectric transformer drive pulse frequency is controlled to decrease.

Thereafter, the value of the 19-bit register 611 is added and updated until the 2-bit output of the comparator 602 reaches 01b, that is, until the output of at least one of the four channels of the inverter 601 becomes equal to the frequency fixing threshold value 606 and the output of all of the four channels becomes greater than the frequency fixing threshold value 606. In addition, the update cycle is 140 μs, which is the output pulse cycle of the timer 604.

As described above, the high voltage output voltage increases as the piezoelectric transformer drive pulse frequency decreases. The dropper circuit of the piezoelectric transformer driver voltage circuit 303 starts operating when the high voltage output voltage reaches near the target voltage. Because of this, the detected value of the 8-bit ADC 313 decreases, and thereby the output of the inverter 601 increases.

At the time of adding and updating the 19-bit register 611, the computation unit 603 compares the higher 9-bit value of the 19-bit value, which is the result of addition, and the 9-bit value of the division ratio counter upper limit value 609 and controls so that the higher 9-bit value of the 19-bit value does not exceed the 9-bit value of the division ratio counter upper limit value 609. In other words, if the higher 9-bit value of the 19-bit value of the 19-bit register 611 exceeds the 9-bit value of the division ratio counter upper limit value 609, the updated value of the 19-bit register 611 is limited to the division ratio counter upper limit value 609.

As described above, by making the same the piezoelectric transformer drive pulse frequencies that the piezoelectric transformer drive circuit 304 as the primary voltage supply device applies (supplies) to the primary electrode side of the plurality of the piezoelectric transformers, the drive frequencies of the adjacently positioned piezoelectric transformers are differentiated. Therefore, interference of the high voltage output on the secondary side is reduced, thereby preventing problems, such as causing ripples in the high voltage output.

The high voltage power source device 301 of the present embodiment is explained with the output voltage for constant voltage control (target value for the charging bias voltage in the color image forming apparatus) being −1100 V and the frequency fixing threshold value 606 of the piezoelectric transformer being 20 V. However, these values are merely examples and are not limited thereto. In addition, various output voltages may be used by the plurality of channels. Moreover, the present embodiment may be realized by changing a constant for peripheral circuits in correspondence with the frequency characteristics even if the frequency characteristics are changed by using a piezoelectric transformer different from the piezoelectric transformer used in the present embodiment.

Further, in the present embodiment, the explanation is made with a fixed output load for simplifying the explanation. However, the present embodiment can support a fluctuation of the load due to the condition of the photosensitive drums or when another high voltage bias source is used. Furthermore, in the present embodiment, the explanation is made for an image forming apparatus with a four-color configuration. However, the image forming apparatus may be configured for two, three or more than four colors.

As explained above, according to the first embodiment, the piezoelectric transformer drive pulse frequencies applied to the primary side of a plurality of piezoelectric transformers is configured to the same frequency. As a result, because the drive frequencies of the adjacent piezoelectric transformers become different, the high voltage outputs on the secondary side do not interfere with each other. Therefore, problems, such as rippling on the high voltage output and the like, are prevented, thereby providing an advantage to obtain stable high voltage outputs.

Second Embodiment

In a second embodiment, the configuration of the high voltage controller ASIC of the high voltage power source device is different from the configuration in the first embodiment The configuration in the second embodiment is explained below based on FIGS. 14 and 15. Explanation of parts that are the same as those in the above-described first embodiment is omitted by applying the same symbols.

Figure 14:
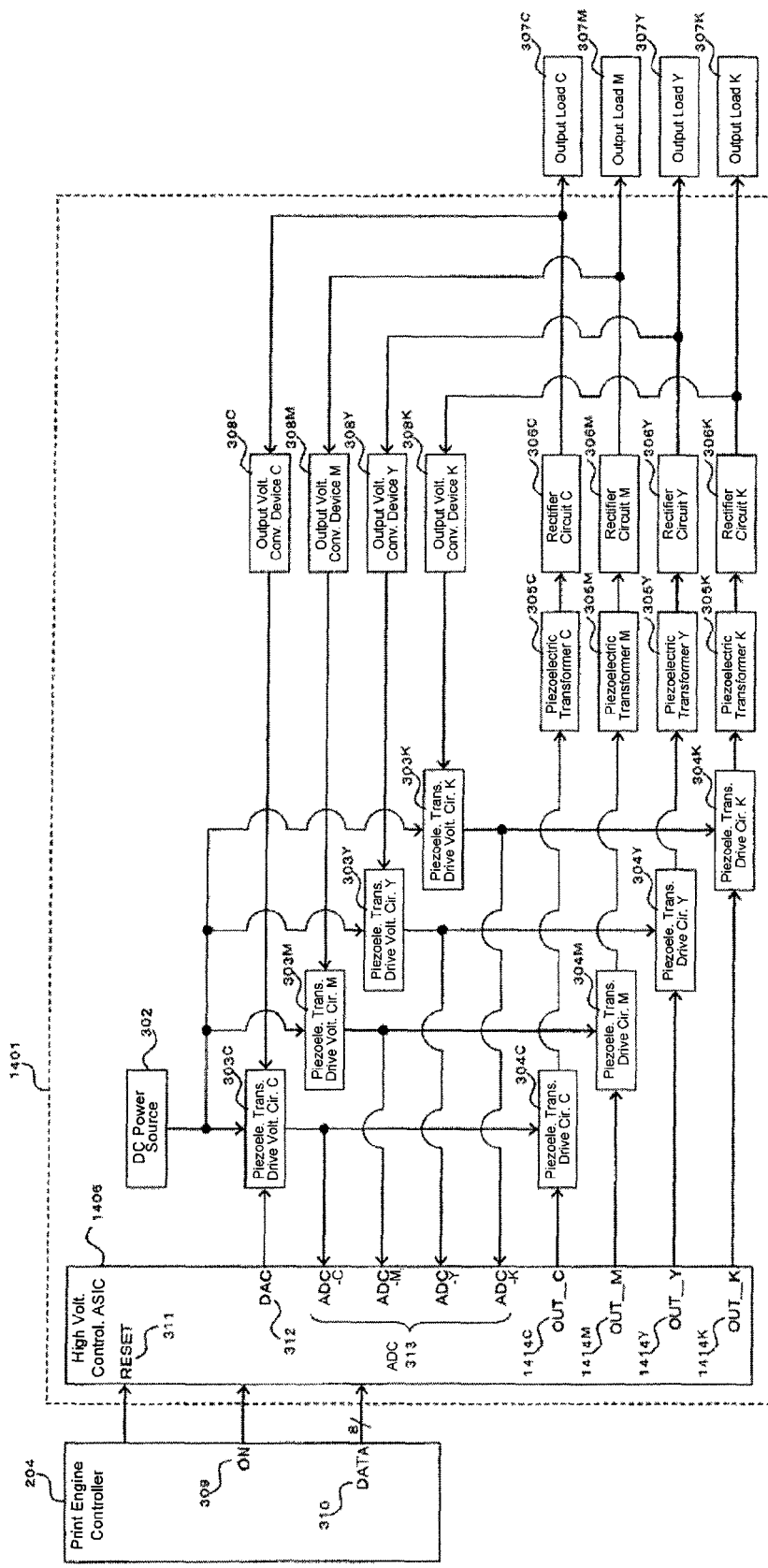
FIG. 14 is a block diagram illustrating a configuration of the high voltage power source device according to a second embodiment.

FIG. 14 is a block diagram illustrating a configuration of the high voltage power source device according to the second embodiment. In FIG. 14, the high voltage power source device 1401 includes a high voltage controller 1406 as a single frequency setting device. The high voltage controller ASIC 1406 includes four OUT ports as output ports for four channels that output piezoelectric transformer drive pulses, namely an OUT 1414C that outputs a piezoelectric transformer drive pulse to the piezoelectric transformer drive circuit 304C, an OUT 1414M that outputs a piezoelectric transformer drive pulse to the piezoelectric transformer drive circuit 304M, an OUT 1414Y that outputs a piezoelectric transformer drive pulse to the piezoelectric transformer drive circuit 304Y, and an OUT 1414K that outputs a piezoelectric transformer drive pulse to the piezoelectric transformer drive circuit 304K.

These OUT 1414C, OUT 1414M, OUT 1414Y and OUT 1414K are inputted to the piezoelectric transformer drive circuits 304C, 304M, 304Y and 304K, respectively.

At the piezoelectric transformer 305 for each channel, a low voltage for an input is stepped up to a high voltage and outputted as a high voltage output by the drive of the piezoelectric transformer drive circuits 304C, 304M, 304Y and 304K, respectively. The high voltage output is outputted to the output load 307 and is feedbacked to the output voltage conversion device 308, after being rectified to a direct current by the rectifier circuit 306.

Figure 15:
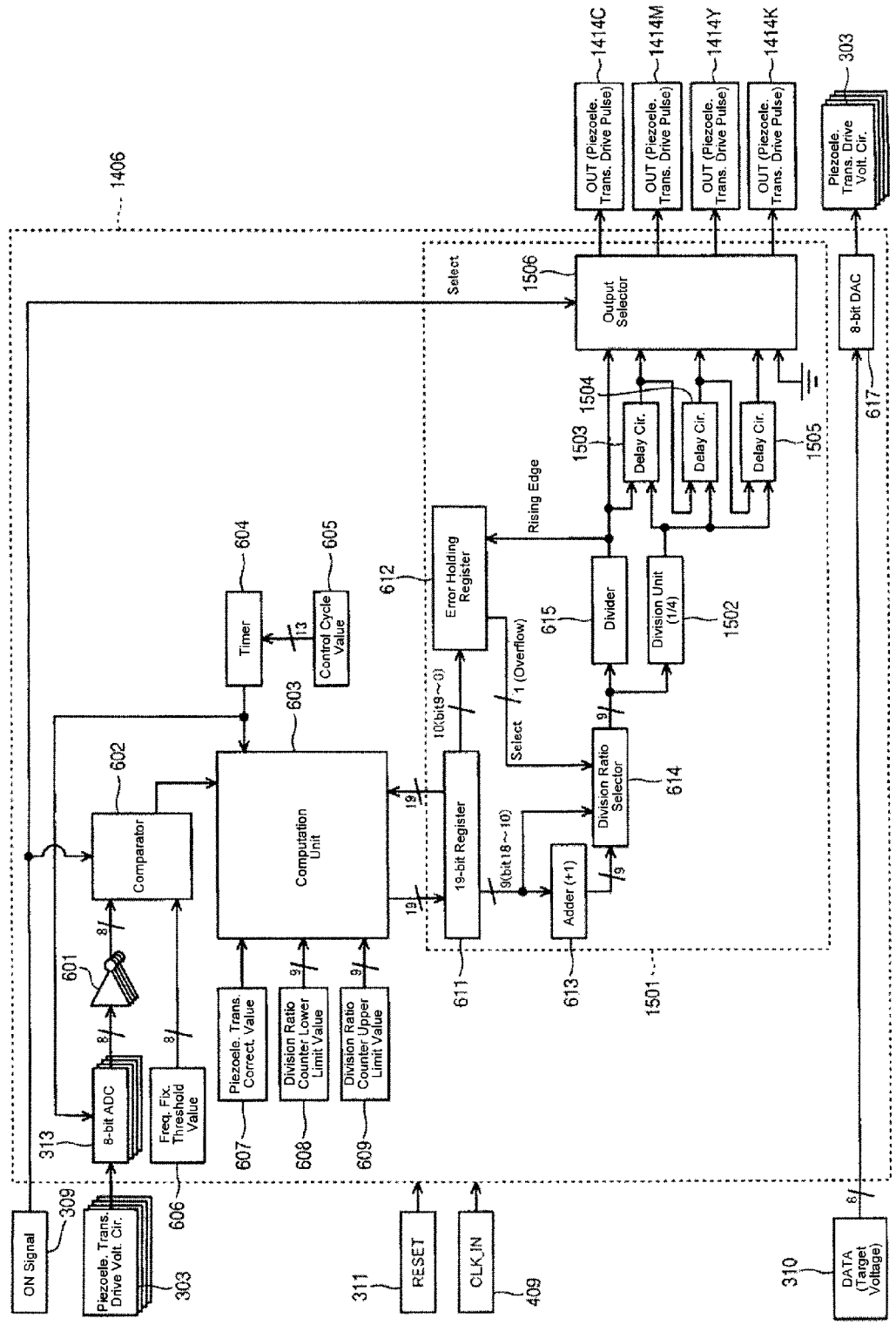
FIG. 15 is a block diagram illustrating a circuit configuration of the high voltage controller ASIC according to the second embodiment.

FIG. 15 is a block diagram illustrating a circuit configuration of a high voltage controller application specification integrated circuit (ASIC) according to the second embodiment. In FIG. 15, a binary pulse output generation part 1501 as a phase control device that shifts a phase of the piezoelectric transformer drive pulse includes a division unit (1/4) 1502, delay circuits 1503, 1504 and 1505, and an output selector 1506 in addition to the configuration of the first embodiment shown in FIG. 6.

The division unit (1/4) 1502 divides the division ratio value outputted from the division ratio selector 614 by 1/4 and inputs to the delay circuits 1503, 1504 and 1505. The delay circuits 1503, 1504 and 1505 output inputted signals by delaying 1/4 of the division ratio vale inputted from the division ratio selector 614. Therefore, the delay circuit 1503 outputs the signal inputted from the divider 615 by delaying by 1/4 of the division ratio value. The delay circuit 1504 outputs the signal inputted from the delay circuit 1503 by delaying by 1/4 of the division ratio value. The delay circuit 1505 outputs the signal inputted from the delay circuit 1504 by delaying by 1/4 of the division ratio value.

The output selector 1506 outputs, to the OUT 1414C, OUT 1414M, OUT 1414Y and OUT 1414K, the output of the divider 615, outputs of the delay circuits 1503, 1504 and 1505, respectively, at the time when the high voltage output is on.

Action of the above-described configuration is explained. Parts that are different from those in the first embodiment are explained below. Explanation of the action that is the same as in the first embodiment is omitted. First, operation of the high voltage controller ASIC 206 is explained based on FIG. 15. The image forming apparatus of the present embodiment is configured by four colors; black (K), yellow (Y), magenta (M) and cyan (C). In FIG. 15, the part that is configured by units for the respective colors is indicated by a 4-layer block, and the unit that is used commonly by the four colors is indicated by a single-layer block.

The output value of the division ratio selector 614 is inputted to the division unit (1/) 1502. The division unit (1/4) 1502 outputs the output value of the vision ratio selector 614, that is, the division ratio value, to the delay circuits 1503, 1504 and 1505 by dividing the division ratio value by 1/4 . Operation of the division circuit is known, and therefore, the explanation is omitted.

For the output of the divider 615, the delay circuit 1503 outputs, to the output selector 1506, a pulse for which the timing of a rising edge is delayed by time that corresponds to a value of a 1/4 of the above-described division ratio value. For the output of the delay circuit 1503, the delay circuit 1504 outputs, to the output selector 1506, a pulse for which the timing of a rising edge is delayed by time that corresponds to a value of a 1/4 of the above-described division ratio value. For the output of the delay circuit 1504, the delay circuit 1505 outputs, to the output selector 1506, a pulse for which the timing of a rising edge is delayed by time that corresponds to a value of a 1/4 of the above-described division ratio value. The ON duty of the pulse is 30% for the output of the divider 615 and the output of each delay circuit.

When the high voltage output ON signal 309 is High, the output selector 1506 outputs, as piezoelectric transformer drive pulses, the outputs of the divider 615 and the delay circuits 1503, 1504 and 1505 to the OUT 1414C, OUT 1414M, OUT 1414Y and 1414K, respectively.

In FIG. 14, the output pulses of OUT 1414C, 1414M, 1414Y and 1414K are inputted to the piezoelectric transformer drive circuits 304C, 304M, 304Y and 304K, respectively. The operation of each piezoelectric transformer drive circuit 304 is the same as the operation explained in the first embodiment using FIG. 4. Therefore, the explanation is omitted.

Figure 16:
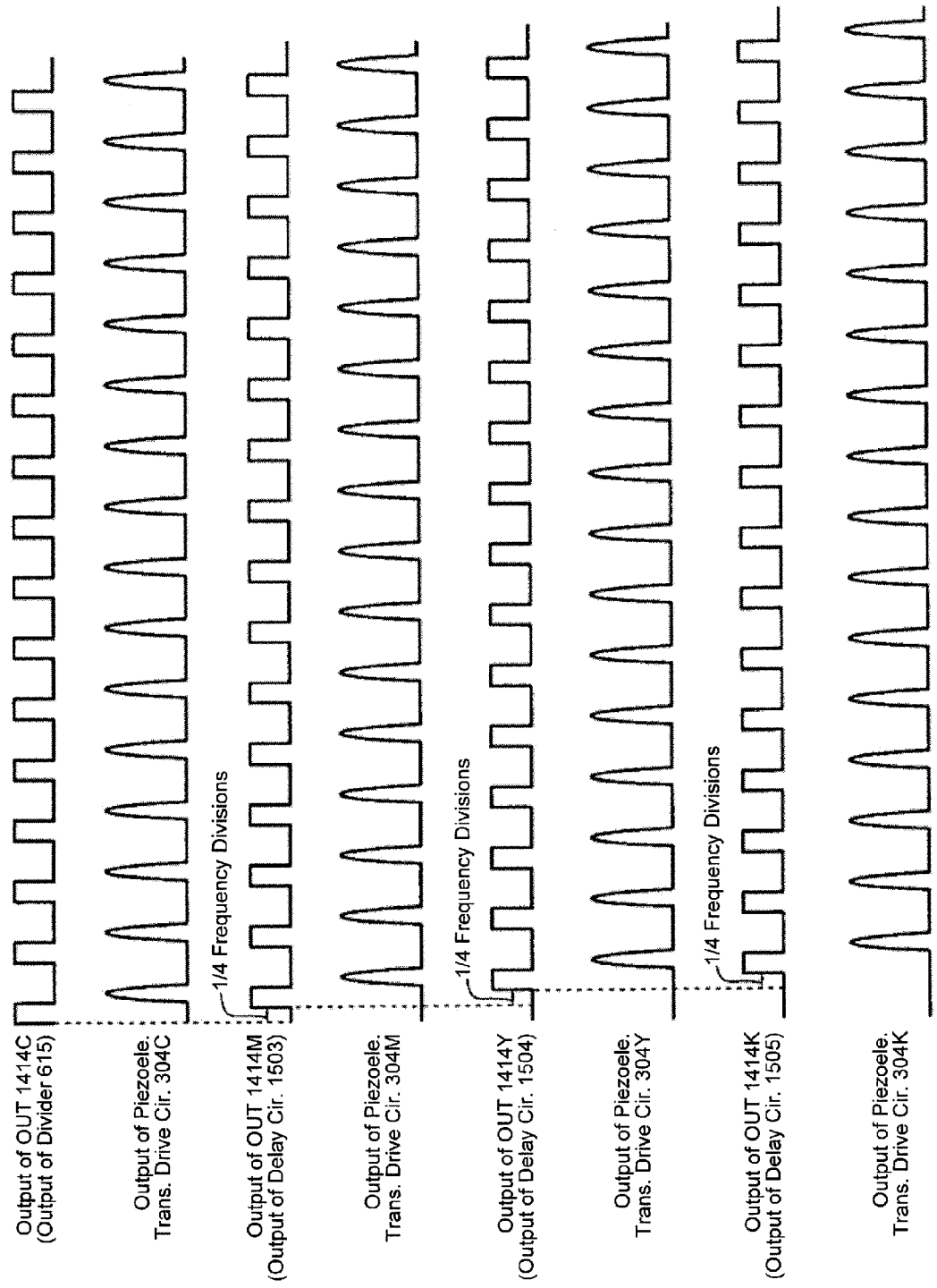
FIG. 16 is an explanatory diagram illustrating the drive pulse and the piezoelectric transformer primary side input waveform according to the second embodiment.

The above-described output pulses of the OUT 1414C (divider 615), OUT 1414M (delay circuit 1503), OUT 1414Y (delay circuit 1504) and OUT 1414K (delay circuit 1505) and the outputs of the piezoelectric transformer drive circuits 304C, 304M, 304Y and 304K are shown in FIG. 16. Schematic diagrams of a drain current of the FET 43 shown in FIG.

4 on the primary side of the piezoelectric transformer 305 in a case where the delay circuits are used and a case where the delay circuits are not used, are shown in FIGS. 17A and 17B.

As shown in FIG. 16, piezoelectric transformer drive pulses are outputted to the piezoelectric transformer drive circuits 304C, 304M, 304Y and 304K by shifting the phase by 1/4 frequency divisions using the delay circuits 1503, 1504 and 1505. Therefore, the outputs of the piezoelectric transformer drive circuits 304C, 304M, 304Y and 305K are also outputted as the phase is shifted by 1/4 frequency divisions.

By outputting the piezoelectric transformer drive pulses to the piezoelectric transformer drive circuits 304C, 304M, 304Y and 305K by shifting the pulses by the phase by 1/4 frequency divisions, the peak of the drain current of the FET 413 is lowered as shown in FIG. 17B, compared with a case where the piezoelectric transformer drive pulses are outputted without shifting the phase as shown in FIG. 17A. Therefore, the peak current of the piezoelectric transformer drive circuit 304 (primary side) is reduced.

The high voltage power source device 1401 of the present embodiment is explained with the output voltage (target value of a charging bias voltage in a color image forming apparatus) for the constant voltage control as being −1100 V, and the frequency fixing threshold value 606 of the piezoelectric transformer as being 20V. However, these are examples and are not limited to these values. In addition, various output voltages may be used for the plurality of channels.

Moreover, the present embodiment may be realized by changing a constant for peripheral circuits in correspondence with the frequency characteristics even if the frequency characteristics are changed by using a piezoelectric transformer different from the piezoelectric transformer used in the present embodiment. Further, in the present embodiment, the explanation is made with a fixed output load for simplifying the explanation. However, the present embodiment can support a fluctuation of the load due to the condition of the photosensitive drums or when another high voltage bias source is used. Furthermore, in the present embodiment, the explanation is made for an image forming apparatus with a four-color configuration. However, the image forming apparatus may be configured for two, three or more than four colors.

As explained above, in the second embodiment, in addition to the advantages of the first embodiment, there is an advantage that the peak current of the piezoelectric transformer drive circuit (primary side) is reduced by outputting a plural number of piezoelectric transformer drive pulses by shifting the timing of the rising edges of the pulses. In the first and second embodiments, the explanation is made with the image forming apparatus as an electrographic color printer. However, the image forming apparatus is not limited to this and may be a color photocopy machine, a facsimile, a color multi function peripheral (MFP) including such functions, and the like.

What is claimed is:

1. A high voltage power source device, comprising:
a plurality of piezoelectric transformers, each of the piezoelectric transformers being formed with a primary electrode and a secondary electrode on piezoelectric ceramics, receiving a primary voltage at the primary electrode, and generating a second voltage from the secondary electrode;
a plurality of switching elements, each of the switching elements driving a respective one of the piezoelectric transformers;
a plurality of primary voltage supply devices, each of the primary voltage supply devices supplying the primary voltage to the primary electrode of the respective one of the plurality of piezoelectric transformers by driving the respective one of the plurality of switching elements when the secondary voltage is generated from the respective one of the second electrodes; and
a frequency setting device that sets a frequency for driving a respective one of the plurality of switching elements, wherein
the respective one of the primary voltage supply devices supply the primary voltage to the respective one of the primary electrodes by driving the respective one of the switching elements at the same frequency, and
the frequency setting device sets the same frequency for the respective one of the plurality of switching elements.

2. The high voltage power source device according to claim 1, wherein
the frequency setting device includes a drive frequency fixing threshold value, and the frequency setting device compares an output of the primary voltage supply device and the drive frequency fixing threshold value and determines whether or not to fix the frequency.

3. The high voltage power source device according to claim 2, wherein
the frequency setting device includes a phase control device that shifts a phase of a pulse that drives the respective one of the plurality of switching elements.

4. An image forming apparatus, comprising: the voltage power source device according to claim 1.

5. The high voltage power supply device according to claim 1, further comprising:
a voltage detection device that detects an output of the secondary voltage; and
a dropper circuit that inputs the secondary voltage detected by the voltage detection device and a target voltage, wherein
the dropper circuit operates when the secondary voltage detected by the voltage detection device reaches the target voltage.

6. A high voltage power source device for an image forming apparatus, comprising:
a plurality of piezoelectric transformers, each comprising a primary electrode and a secondary electrode, the primary electrode configured to receive a primary voltage, and the secondary electrode configured to provide a secondary voltage;
a plurality of switching elements configured to respectively drive the piezoelectric transformers, each of the switching elements being configured to receive the primary voltage;
a voltage detection device configured to detect the secondary voltage;
a dropper circuit configured to receive a target voltage and the secondary voltage detected by the voltage detection device, and configured to operate when the secondary voltage detected by the voltage detection device reaches the target voltage; and
a frequency setting device configured to set a frequency for driving a respective one of the switching elements, wherein
each of the switching elements is configured to pass the primary voltage to the primary electrode of the respective one of the piezoelectric transformers when the secondary voltage is generated at the second electrode of the respective one of the piezoelectric transformers,
each of the switching elements is driven at the same frequency, and wherein the frequency setting device sets the same frequency for all of the switching elements.

7. The high voltage power source device according to claim 6, wherein
the frequency setting device is configured to receive a drive frequency fixing threshold value, and
the frequency setting device is configured to compare the primary voltage with the drive frequency fixing threshold value to determine whether or not to alter the set frequency.

8. A high voltage power source device, comprising:
a plurality of drive circuits, each configured to receive a DC primary voltage and to pass a respective half sine wave having a first peak;
a plurality of piezoelectric transformers, each configured to receive a respective one of the half sine waves and to generate an AC high voltage output signal; and
a plurality of rectifiers, each configured to convert a respective one of the AC high voltage output signals to a negative DC high voltage output signal; and
a frequency setting device configured to determine a plurality of set resonance frequencies for driving a plurality of switching elements, wherein
each of the plurality of drive circuits is configured to generate the half sine wave at the set resonance frequency, and
the set resonance frequency of each of the plurality of drive circuits is set by a respective frequency control signal.

9. The high voltage power source device of claim 8, wherein:
each of the plurality of drive circuits is driven at the same resonance frequency.

10. The high voltage power source device of claim 8, wherein:
each of the plurality of drive circuits is driven at a different resonance frequency, and the different resonance frequencies are evenly spaced from each other.

11. The high voltage power source device of claim 8, further comprising:
a plurality of drive voltage circuits, each configured to receive a DC supply voltage and configured to generate the DC primary voltage based on a target voltage and a proportional voltage that is proportional to the negative DC high voltage output signal.

12. The high voltage power source device of claim 11, further comprising:
a plurality of output voltage conversion devices configured to generate the plurality of proportional voltages based on the plurality of negative DC high voltage output signals.

13. The high voltage power source device of claim 12, wherein
the plurality of output voltage conversion devices are configured to generate the plurality of proportional voltages by inverting and dividing the plurality of DC high voltage output signals.

14. The high voltage power source device of claim 11, wherein each of the plurality of drive voltage circuits is configured to detect a respective one of the plurality of proportional voltages and compare the detected proportional voltage to the target voltage, and
each of the plurality of drive voltage circuits is configured to generate the DC primary voltage based on the comparison of the detected proportional voltage to the target voltage.

15. A high voltage power source device, comprising:
a first piezoelectric transformer being formed with a first primary electrode and a first secondary electrode on piezoelectric ceramics, receiving a first primary voltage at the first primary electrode, and generating a first secondary voltage from the first secondary electrode;
a second piezoelectric transformer being formed with a second primary electrode and a second secondary electrode on piezoelectric ceramics, receiving a second primary voltage at the second primary electrode, and generating a second secondary voltage from the second secondary electrode;
a first switching element driving the first piezoelectric transformer;
a second switching element driving the second piezoelectric transformer;
a first primary voltage supply device supplying the first primary voltage to the first primary electrode of the first piezoelectric transformer by driving the first switching element when the first secondary voltage is generated from the first secondary electrode; and
a second primary voltage supply device supplying the second primary voltage to the second primary electrode of the second piezoelectric transformer by driving the second switching element when the second secondary voltage is generated from the second secondary electrode; and
a frequency setting device that sets a frequency for driving the first switching element and the second switching element, wherein
the frequency setting device sets the same frequency for the first switching element and the second switching element.

* * * * *